US011204660B2

(12) United States Patent
Yang et al.

(10) Patent No.: US 11,204,660 B2
(45) Date of Patent: Dec. 21, 2021

(54) TOUCH SENSOR AND DISPLAY DEVICE INCLUDING THE SAME

(71) Applicant: SAMSUNG DISPLAY CO., LTD., Yongin-si (KR)

(72) Inventors: Sung Jin Yang, Cheonan-si (KR); Hyun Sik Park, Cheonan-si (KR); Chun Gi You, Asan-si (KR); Sung Ho Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/887,529

(22) Filed: May 29, 2020

(65) Prior Publication Data

US 2021/0141477 A1  May 13, 2021

(30) Foreign Application Priority Data

Nov. 12, 2019  (KR) .......................... 10-2019-0144123

(51) Int. Cl.
*G06F 3/041* (2006.01)
*G06F 3/047* (2006.01)
*G06F 3/044* (2006.01)

(52) U.S. Cl.
CPC ............ *G06F 3/0412* (2013.01); *G06F 3/047* (2013.01); *G06F 3/0445* (2019.05); *G06F 2203/04112* (2013.01)

(58) Field of Classification Search
CPC ...... G06F 3/0412; G06F 3/0445; G06F 3/047; G06F 2203/04112; G06F 2300/0426
See application file for complete search history.

(56) References Cited

U.S. PATENT DOCUMENTS

2010/0231549 A1* 9/2010 Chien .................. G06F 3/0412
345/174
2013/0002569 A1* 1/2013 Kang .................. G06F 3/0446
345/173
(Continued)

FOREIGN PATENT DOCUMENTS

KR  20110025374  3/2011
KR  20170089467  8/2017
(Continued)

*Primary Examiner* — Nitin Patel
*Assistant Examiner* — Amen W. Bogale
(74) *Attorney, Agent, or Firm* — F. Chau & Associates, LLC

(57) ABSTRACT

A display device includes a first substrate, light emitting elements, a second substrate, and a touch sensor on the second substrate. The touch sensor includes a first touch conductive layer on the second substrate, a touch insulating layer on the first touch conductive layer, and a second touch conductive layer on the touch insulating layer. The first touch conductive layer includes first sub-sensing electrodes, a connecting portion connecting the first sub-sensing electrodes adjacent to each other, and second sub-sensing electrodes. The second touch conductive layer includes a third sub-sensing electrode connected to one of the first sub-sensing electrodes through contact holes passing through the touch insulating layer, and a fourth sub-sensing electrode electrically connected to one of the second sub-sensing electrodes through contact holes passing through the touch insulating layer electrically connecting the second sub-sensing electrodes adjacent to each other.

20 Claims, 30 Drawing Sheets

(56) References Cited

U.S. PATENT DOCUMENTS

| | | | | |
|---|---|---|---|---|
| 2014/0168109 A1* | 6/2014 | Kang | ............... | G06F 3/0446 345/173 |
| 2014/0218631 A1* | 8/2014 | Kang | ............... | G06F 3/0445 349/12 |
| 2015/0130745 A1* | 5/2015 | Choi | ............... | G06F 3/0446 345/174 |
| 2015/0220202 A1* | 8/2015 | Choung | ............ | G06F 3/0446 345/174 |
| 2016/0048248 A1* | 2/2016 | Na | ............... | G06F 3/047 345/174 |
| 2016/0085339 A1* | 3/2016 | Yashiro | ............ | G06F 3/0445 345/174 |
| 2016/0202789 A1* | 7/2016 | Kim | ............... | G06F 3/0412 345/174 |
| 2018/0246599 A1* | 8/2018 | Choi | ............... | G01B 7/34 |

FOREIGN PATENT DOCUMENTS

| | | |
|---|---|---|
| KR | 20180025023 | 3/2018 |
| KR | 20180058284 | 6/2018 |

* cited by examiner

TOUCH SENSOR AND DISPLAY DEVICE INCLUDING THE SAME

This application claims priority under 35 U.S.C. § 119 to Korean Patent Application No. 10-2019-0144123, filed on Nov. 12, 2019 in the Korean Intellectual Property Office, the disclosure of which is incorporated by reference herein in its entirety.

TECHNICAL FIELD

The present disclosure relates to a display and, more specifically, to a touch sensor and a display device including the same.

DISCUSSION OF THE RELATED ART

Modern display devices may come in a wide variety of shapes and sizes and are often integrated with touch sensors so as to form touchscreens. While previously the use of touchscreens was limited to small portable devices, such as smartphones, today's touchscreens are used in various other devices such as personal computers where the use of touch screens may replace more conventional input devices such as physical keyboards.

A touch sensor, such as that of a touchscreen display device, includes a plurality of electrode portions disposed in a sensing area for sensing a touch input. When the resistance of the electrode portions is high, not only will the power consumption of the display device itself including the touch sensor increase, but also a resistive-capacity (RC) delay may occur within the touch sensor.

SUMMARY

An exemplary embodiment of the present disclosure provides a display device in which the resistance of electrode portions of a touch sensor is lowered.

An exemplary embodiment of the present disclosure provides a touch sensor in which the resistance of electrode portions is lowered.

According to an exemplary embodiment of the present disclosure, a display device includes a first substrate. A plurality of light emitting elements is disposed on the first substrate. A second substrate is disposed opposite the first substrate. A touch sensor is disposed on the second substrate. The touch sensor includes a first touch conductive layer which is disposed on the second substrate and includes a first transparent conductive material, a touch insulating layer disposed on the first touch conductive layer, and a second touch conductive layer which is disposed on the touch insulating layer and includes a second transparent conductive material. The first touch conductive layer includes a plurality of first sub-sensing electrodes arranged in a first direction. A connecting portion is configured to connect the first sub-sensing electrodes adjacent to each other. A plurality of second sub-sensing electrodes which are arranged in a second direction crossing the first direction are spaced apart from the first sub-sensing electrodes and the connecting portion. The second touch conductive layer includes a third sub-sensing electrode electrically connected to one of the first sub-sensing electrodes through a plurality of first contact holes passing through the touch insulating layer. A fourth sub-sensing electrode is electrically connected to one of the second sub-sensing electrodes through a plurality of second contact holes passing through the touch insulating layer so as to electrically connect the second sub-sensing electrodes adjacent to each other. The fourth sub-sensing electrode is spaced apart from the third sub-sensing electrode.

The third sub-sensing electrode may at least partially overlap the first sub-sensing electrode. The fourth sub-sensing electrode may at least partially overlap the second sub-sensing electrode.

The fourth sub-sensing electrode may extend primarily in the second direction, may at least partially overlap the connecting portion in a thickness direction, and may be electrically insulated from the connecting portion.

The first touch conductive layer may further include a first dummy electrode disposed between the first sub-sensing electrode and the second sub-sensing electrode which are adjacent to each other. The first dummy electrode may be a floating electrode which is spaced apart from the first sub-sensing electrode adjacent thereto with a separation space disposed therebetween and spaced apart from the second sub-sensing electrode adjacent thereto with a separation space disposed therebetween.

The fourth sub-sensing electrode may at least partially cover the separation space between the first dummy electrode and the second sub-sensing electrode and a portion of the first dummy electrode in a plan view. The third sub-sensing electrode may at least partially cover the separation space between the first dummy electrode and the first sub-sensing electrode and another portion of the first dummy electrode in the plan view.

The second touch conductive layer may further include a second dummy electrode disposed between the third sub-sensing electrode and the fourth sub-sensing electrode which are adjacent to each other. The second dummy electrode may be spaced apart from the third sub-sensing electrode adjacent thereto with a separation space disposed therebetween and spaced apart from the fourth sub-sensing electrode adjacent thereto with a separation space disposed therebetween.

A width of the second dummy electrode may be larger than a width of the first dummy electrode. The second dummy electrode may at least partially cover the separation space between the first dummy electrode and the second sub-sensing electrode and the separation space between the first dummy electrode and the first sub-sensing electrode.

The second dummy electrode may include a plurality of dummy patterns separated from each other. The first dummy electrode may at least partially cover a separation space between the dummy patterns adjacent to each other.

The touch sensor may further include a third touch conductive layer disposed between the first touch conductive layer and the touch insulating layer.

The third touch conductive layer may include an opaque conductive material.

The touch sensor may further include a plurality of touch wires connected to the plurality of first sub-sensing electrodes or the plurality of second sub-sensing electrodes.

The touch wire may include a first wire portion and a second wire portion disposed on the first wire portion. The first touch conductive layer may further include the first wiring portion. The third touch conductive layer may further include the second wiring portion.

The second wiring portion may be disposed directly on the first wiring portion and may be electrically connected to the first wiring portion.

The touch sensor may further include a cap pattern covering the plurality of touch wires. The second touch conductive layer may further include the cap pattern.

The first transparent conductive material and the second transparent conductive material may each be formed including amorphous indium tin oxide.

The first substrate may include a display substrate. The second substrate may include an encapsulation substrate sealing the plurality of light emitting elements. The touch sensor may be disposed directly on the encapsulation substrate.

The sensing electrodes of the touch sensor each have a planar shape.

The display device may further include a polarizing film disposed on the touch sensor and an adhering member disposed between the polarizing film and the touch sensor. The adhering member may come into direct contact with the second touch conductive layer.

Planar profiles of the third sub-sensing electrode and the first sub-sensing electrode, which overlaps the third sub-sensing electrode in the thickness direction, may be the same as each other. Planar profiles of the fourth sub-sensing electrode and the second sub-sensing electrode, which overlaps the fourth sub-sensing electrode in the thickness direction, may be the same as each other.

According to an exemplary embodiment of the present disclosure, a touch sensor includes a first touch conductive layer which includes a first transparent conductive material. A touch insulating layer is disposed on the first touch conductive layer. A second touch conductive layer is disposed on the touch insulating layer and includes a second transparent conductive material. The first touch conductive layer includes a plurality of first sub-sensing electrodes arranged in a first direction, a connecting portion configured to connect the first sub-sensing electrodes adjacent to each other, and a plurality of second sub-sensing electrodes, which are arranged in a second direction crossing the first direction, and are spaced apart from the first sub-sensing electrodes and the connecting portion. The second touch conductive layer includes a third sub-sensing electrode electrically connected to one of the first sub-sensing electrodes through a plurality of first contact holes passing through the touch insulating layer. A fourth sub-sensing electrode is electrically connected to one of the second sub-sensing electrodes through a plurality of second contact holes passing through the touch insulating layer so as to electrically connect the second sub-sensing electrodes adjacent to each other, and the fourth sub-sensing electrode is spaced apart from the third sub-sensing electrode.

The third sub-sensing electrode may at least partially overlap the first sub-sensing electrode. The fourth sub-sensing electrode at least partially overlaps the second sub-sensing electrode. The fourth sub-sensing electrode extends primarily in the second direction. The fourth sub-sensing electrode at least partially overlaps the connecting portion in a thickness direction and is electrically insulated from the connecting portion.

The touch sensor may further include a third touch conductive layer disposed between the first touch conductive layer and the touch insulating layer. The third touch conductive layer may include an opaque conductive material. The touch sensor may thither include a plurality of touch wires connected to the plurality of first sub-sensing electrode or the plurality of second sub-sensing electrode. The touch wire may include a first wire portion and a second wire portion disposed on the first wire portion. The first torch conductive layer may further include the first wiring portion. The third touch conductive layer may further include the second wiring portion.

It should be noted that objects of the present disclosure are not limited to the above-mentioned objects, and other unmentioned objects will be apparent to those skilled in the art from the following descriptions.

BRIEF DESCRIPTION OF THE DRAWINGS

The above and other aspects and features of the present disclosure will become more apparent by describing, exemplary embodiments thereof in detail with reference to the attached drawings, in which.

DETAILED DESCRIPTION OF THE EMBODIMENTS

Figure 1:
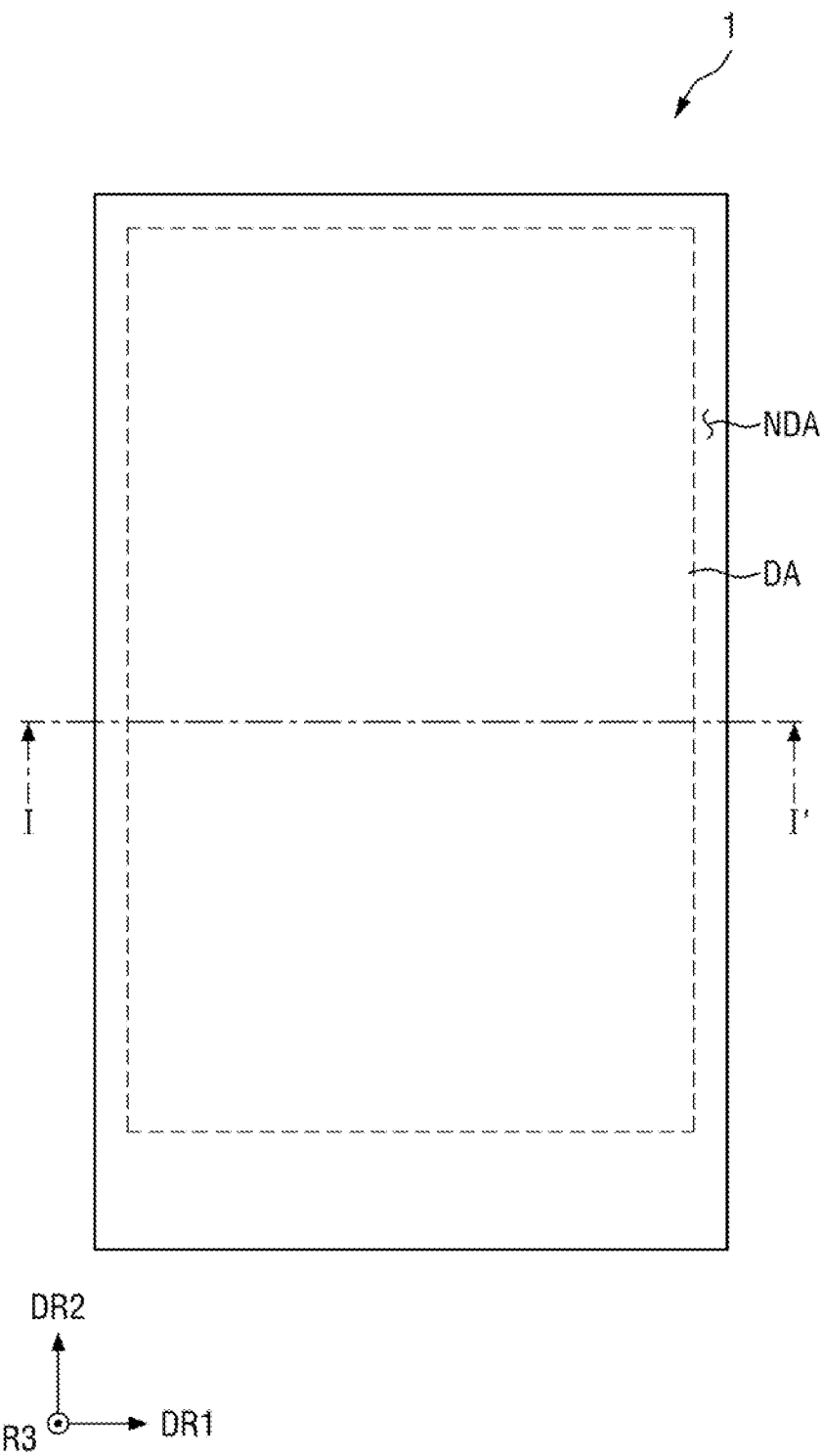
FIG. 1 is a plan view illustrating a display device according to an exemplary embodiment of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

It will be understood that when an element is referred to as being related to another element such as being "coupled" or "connected" to another element, it can be directly coupled or connected to the other element or intervening elements may be present therebetween. Other expressions that explain the relationship between elements, such as "between," "directly between," "adjacent to," or "directly adjacent to," should be construed in the same way.

Throughout the specification and the figures, the same reference numerals may refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. However, the phrase "consisting of" is meant to preclude the presence of other elements.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the an, considering the measurement in question and the error associated with measurement of the particular quantity (i.e., the limitations of the measurement system). For example, "about" can mean within one or more standard deviations, or within ±30%, 20%, 0% or 5% of the stated value.

Exemplary embodiments of the present disclosure are described herein with reference to cross section illustrations that are schematic illustrations of idealized embodiments. As such, variations from the shapes of the illustrations as a result, for example, of manufacturing techniques and/or tolerances, may be expected. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the present disclosure will be described with reference to the attached drawings.

Figure 2:
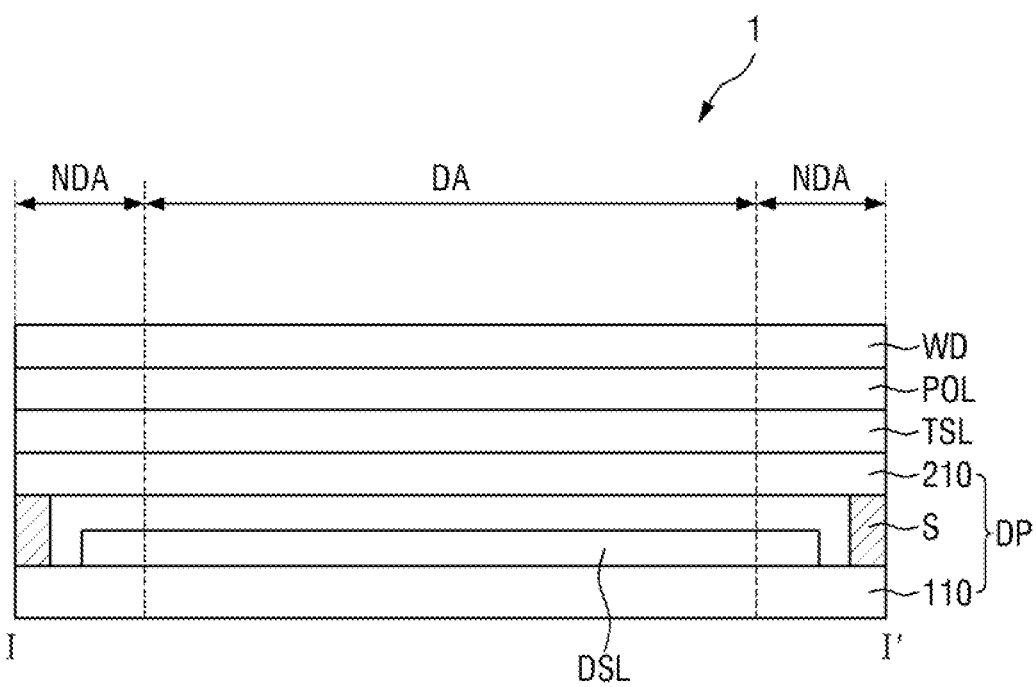
FIG. 2 is a cross-sectional view taken along line I-I' of FIG. 1.

FIG. 1 is a plan view illustrating a display device according to an exemplary embodiment of the present disclosure, and FIG. 2 is a cross-sectional view taken along line I-I' of FIG. 1.

According to exemplary embodiments of the present disclosure, a first direction DR1 and a second direction DR2 are different directions which intersect each other. In the plan view of FIG. 1 the first direction DR1, which is a horizontal direction, and the second direction DR2, which is a vertical direction, are defined for convenience of description. In the following exemplary embodiments, it is assumed that one side in the first direction DR1 indicates a rightward direction in the plan view, the other side in the first direction DR1 indicates a leftward direction in the plan view, one side in the second direction DR2 indicates an upward direction in the plan view, and the other side in the second direction DR2 indicates a downward direction in the plan view. However, the directions mentioned in the provided exemplary embodiments should be understood as relative directions, and the invention is not necessarily limited by the mentioned directions.

Referring to FIGS. 1 and 2, a display device 1 may refer to any electronic device that provides a display screen. Examples of the display device 1 may include a television, a laptop computer, a computer monitor, an electronic billboard, a smart-device such as the Internet of Things, as well as portable electronic devices such as a mobile phone, a smartphone, a tablet computer, a personal computer (PC), an electronic watch, a smartwatch, a watch phone, a mobile communication terminal, an electronic notepad, an electronic book, a portable multimedia player (PMP), a navigation system, a earning device, and a digital camera that provide a display screen.

The display device 1, according to exemplary embodiments of the present disclosure may include two short sides extending primarily in the first direction DR1 and two long sides extending primarily in the second direction DR2. In the plan view, the display device 1 may have a rectangular shape in which corners where the long sides and the short sides meet are right-angled. However, the present disclosure is not necessarily limited thereto, and the display device 1 may have various other shapes in the plan view, such as a rectangular shape with round corners, a square shape, other polygonal shapes, a circular shape, or an elliptical shape.

The display device 1 includes a display area DA, which includes a plurality of pixels, and a non-display area NDA disposed around the display area DA so as to at least partially surround the display are DA. The non-display area might not include any pixels. The display area DA may be an area in which an image is displayed, and the non-display area NDA may be an area in which an image is not displayed. However, in some exemplary embodiments of the present disclosure, in the non-display area NDA, an image may be displayed in limited portions thereof that are adjacent to the display area DA.

In some exemplary embodiments of the present disclosure, the shape of the display area DA may be substantially the same as the shape of the display device 1 in the plan view. For example, the display area DA may have a rectangular shape in the plan view.

The non-display area NDA may be disposed around the display area DA. In the plan view, the non-display area NDA may surround all sides (in the drawings, four sides) of the display area DA. However, the present disclosure is not necessarily limited thereto and the non-display area NDA may partially surround the display area DA so as to contact three, two or one side thereof. In the non-display area NDA, a panel driving circuit which drives a display panel, signal pads connected to the panel driving circuit, a touch driving circuit which inputs a signal to a touch sensor and receives a signal output from the touch sensor, or a touch pad portion connected to the touch driving circuit may be disposed.

In a stacked structure thereof, which may be seen in FIG. 2, the display device 1 may include a display panel DP and a touch sensor TSL disposed on the display panel DP. The display device 1 may further include a polarizing film POL disposed on the touch sensor TSL and a window WD disposed on the polarizing film POL.

The display panel DP may include a self-emitting element. The self-emitting element may include at least one of an organic light emitting diode, a quantum dot light emitting diode, an inorganic matter-based micro light emitting diode (e.g., a micro light emitting diode), and an inorganic matter-based nano light emitting diode (e.g., a nano light emitting diode). Hereinafter, for convenience of description, a case in which the self-emitting element is an organic light emitting diode will be described as an example.

In a stacked structure thereof, the display panel DP includes a first substrate 110, a second substrate 210 disposed on the first substrate 110, and an element layer DSL disposed between the first substrate 110 and the second substrate 210. Also, the display panel DP may further include a sealing material S which is disposed at edge portions of the first substrate 110 and the second substrate 210, between the first substrate 110 and the second substrate 210, so as to adhere the first substrate 110 and the second substrate 210 to each other.

The first substrate 110 is a substrate which supports the element layer DSL. In an exemplary embodiment of the present disclosure, the first substrate 110 may be an insulating substrate formed of glass, quartz, ceramic, plastic, or the like.

The element layer DSL is disposed on the first substrate 110. In an exemplary embodiment of the present disclosure, the element layer DSL may include a thin film transistor TFT, a capacitor, a light emitting element, and a plurality of display signal lines that are disposed on the first substrate 110. The plurality of display signal lines may include a scan line which transmits a scan signal to each of the pixels and a data line which transmits a data signal to each of the pixels.

The second substrate 210 may be an encapsulation substrate which prevents permeation of moisture and oxygen from the outside to the element layer DSL. The second substrate 210 may be formed of transparent glass. However, the present disclosure is not necessarily limited thereto, and the second substrate 210 may also be formed of a polymer film or the like.

The sealing material S may be disposed between the first substrate 110 and the second substrate 210. The sealing material S may be disposed in the non-display area NDA so as to completely surround the display area DA in the plan view. The sealing material S may bond the first substrate 110 and the second substrate 210 to each other and may prevent permeation of impurities such as moisture and oxygen from the outside into a portion between the first substrate 110 and the second substrate 210. In some exemplary embodiments of the present disclosure, the sealing material S may be formed by placing a sealing material such as glass frit between the first substrate 110 and the second substrate 210 and irradiating the sealing material with laser to melt the sealing material.

The touch sensor TSL may be disposed on the display panel DP. The touch sensor TSL may be a capacitance-type sensor and may obtain coordinates of a touch input point. The capacitance type may be a self-capacitance type or a mutual capacitance type. Hereinafter, for convenience of description, a case in which the touch sensor TSL is formed to have a mutual capacitance-type structure will be described as an example, but the present invention is not necessarily limited thereto.

In an exemplary embodiments of the present disclosure, the touch sensor TSL may be disposed on the second substrate 210 in the display panel DP.

In some exemplary embodiments of the present disclosure, a portion of the touch sensor TSL that is disposed in the display area DA may include an electrode portion, and a portion of the touch sensor TSL that is disposed in the non-display area NDA may include a touch signal line which transmits and/or receives a signal to and/or from the electrode portion and a touch pad portion connected to the touch signal line.

In some exemplary embodiments of the present disclosure, a separate adhering layer (e.g., an adhesive layer or the like) might not be disposed between the touch sensor TSL and the second substrate 210. For example, at least one of the electrode portion, the touch signal line, and the touch pad portion of the touch sensor TSL may be disposed immediately above the second substrate 210. Alternatively, when a separate insulating film is disposed between the touch sensor TSL and the second substrate 210, at least one of the electrode portion, the touch signal line, and the touch pad portion of the touch sensor TSL may be disposed immediately above the insulating film.

The polarizing film POL may be disposed on the touch sensor TSL. The polarizing film POL may serve to reduce external light reflection.

The window WD may be disposed on the polarizing film POL. The window WD may include a rigid material such as glass or quartz.

A stacked structure of the touch sensor TSL will be described below.

Figure 3:
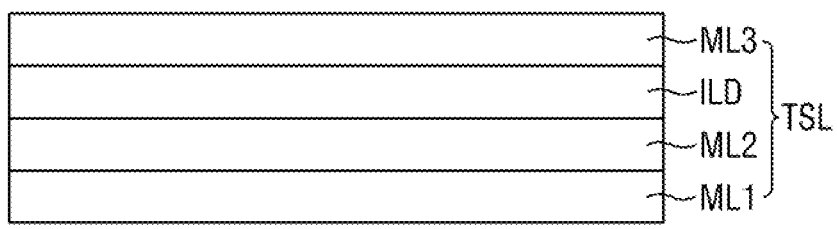
FIG. 3 is a schematic cross-sectional view illustrating a touch sensor according to an exemplary embodiment of the present disclosure.

FIG. 3 is a schematic cross-sectional view illustrating a touch sensor according to an exemplary embodiment of the present disclosure.

Referring to FIG. 3, the touch sensor TSL may include a first conductive layer ML1 disposed on the second substrate 210, a second conductive layer ML2 disposed on the first conductive layer ML1, an insulating layer ILD disposed on the second conductive layer ML2, and a third conductive layer ML3 disposed on the insulating layer ILD.

The first conductive layer ML1 may include a plurality of first sub-sensing electrodes 311 (see FIG. 9) disposed in a sensing area SA (see FIG. 8) which will be described below, a connecting portion 313 (see FIG. 9) which connects the first sub-sensing electrodes which are adjacent to each connecting portion 313 and 315.

Second sub-sensing electrodes 331 (see FIG. 9) may be physically spaced apart from the first sub-sensing electrodes. The second sub-sensing electrodes may be electrically insulated from the first sub-sensing electrodes. The first conductive layer ML1 may further include a first wiring portion LP1 (see FIG. 16) of a touch signal line disposed in a non-sensing area NSA (see FIG. 8) which will be described below.

The first conductive layer ML1 may include a conductive material having light transmittance. As used herein, the phrase "having light transmittance" that the material at least partially transparent or translucent. Examples of the conductive material having transmittance include indium tin oxide (ITO), indium zinc oxide (IZO), Aluminum-doped zinc oxide (AZO), indium tin zinc oxide (ITZO), zinc oxide (ZnO), tin oxide ($SnO_2$), carbon nanotube, graphene, conductive polymer (e.g., poly(3,4-ethylenedioxythiophene) (PEDOT)), and silver nanowire (AgNW). As will be described below, the sensing area at least partially overlaps the display area DA of the display panel DP. The first sub-sensing electrode, the second sub-sensing electrode, and the connecting portion, which are disposed in the sensing area, may include the conductive material having light transmittance and cause light output from the display panel DP to transmit therethrough.

In an exemplary embodiment of the present disclosure, the first conductive layer ML1 may be formed including ITO having an amorphous structure. The resistance of ITO having an amorphous structure in which interatomic distances are not uniform may be relatively higher than the resistance of a material of the second conductive layer ML2 which will be described below, and further, be higher than the resistance of ITO having a crystalline structure in which interatomic distances are more uniform than in the amorphous structure. In this way, when the resistance of a conductive layer constituting the touch sensor TSL is high, the power consumed to drive the touch sensor TSL may increase. Also, when the materials listed above as examples of the material of the first conductive layer ML1 are used in the electrode portion that recognizes a touch input, e.g., the sub-sensing electrodes in the sensing area, or used in the connecting portion, a resistive-capacitive (RC) delay may occur due to high resistance. Therefore, for the conductive layer constituting the electrode portion of the touch sensor TSL to have low resistance while having light transmittance, the third conductive layer ML3, which will be described below, may be electrically connected to the first conductive layer ML1 in the electrode portion.

The second conductive layer ML2 may include a second wiring portion LP2 (see FIG. 16) disposed in the non-sensing area. The second conductive layer ML2 might not be disposed in the sensing area.

The second conductive layer ML2 may include an opaque conductive material. For example, the second conductive layer ML2 may include metals such as gold (Au), silver (Ag), aluminum (Al), molybdenum (Mo), chromium (Cr), titanium (Ti), nickel (Ni), neodymium (Nd), copper (Cu), and platinum (Pt) or alloys thereof. In some exemplary embodiments of the present disclosure, the second conductive layer ML2 may be formed of a single-layer structure or a multi-layer structure. As an example, the second conductive layer ML2 may have a Ti/Al/Ti three-layer structure.

The insulating layer ILD may be disposed on the second conductive layer ML2. The insulating layer ILD may be disposed across the sensing area and the non-sensing area. The insulating layer ILD may be disposed between the first conductive layer ML1 and the second conductive layer ML2. In some exemplary embodiments of the present disclosure, the insulating layer ILD may include an insulating material. In some exemplary embodiments of the present disclosure, the insulating material may be an inorganic insulating material or an organic insulating material. The inorganic insulating material may include at least one of aluminum oxide, titanium oxide, silicon oxide, silicon oxynitride, zirconium oxide, and hafnium oxide. The organic insulating material may include at least one of acrylic resin, methacrylate resin, polyisoprene, vinyl resin, epoxy resin, urethane resin, cellulose resin, siloxane resin, polyimide resin, polyamide resin, and perylene resin.

The third conductive layer ML3 may be disposed on the insulating layer ILD. The third conductive layer ML3 may include a third sub-sensing electrode 315 (see FIG. 9) and a fourth sub-sensing electrode 335 (see FIG. 9) which are both disposed in the sensing area. The third sub-sensing electrode and the fourth sub-sensing electrode may be electrically connected to the first sub-sensing electrode and the second sub-sensing electrode disposed in the first conductive layer ML1, respectively, and, accordingly, the resistance of the electrode portion itself of the sensing area may be lowered. This will be described in more detail below. The third conductive layer ML3 may further include a cap pattern LP3 (see FIG. 16) disposed in the non-sensing area.

The third conductive layer ML3 may include a conductive material having light transmittance. Examples of the conductive material having light transmittance include ITO, IZO, AZO, ITZO, ZnO, $SnO_2$, carbon nanotube, graphene, conductive polymer (e.g., PEDOT), and AgNW. In some exemplary embodiments of the present disclosure, the third conductive layer ML3 may include the same material as the first conductive layer ML1.

Figure 4:
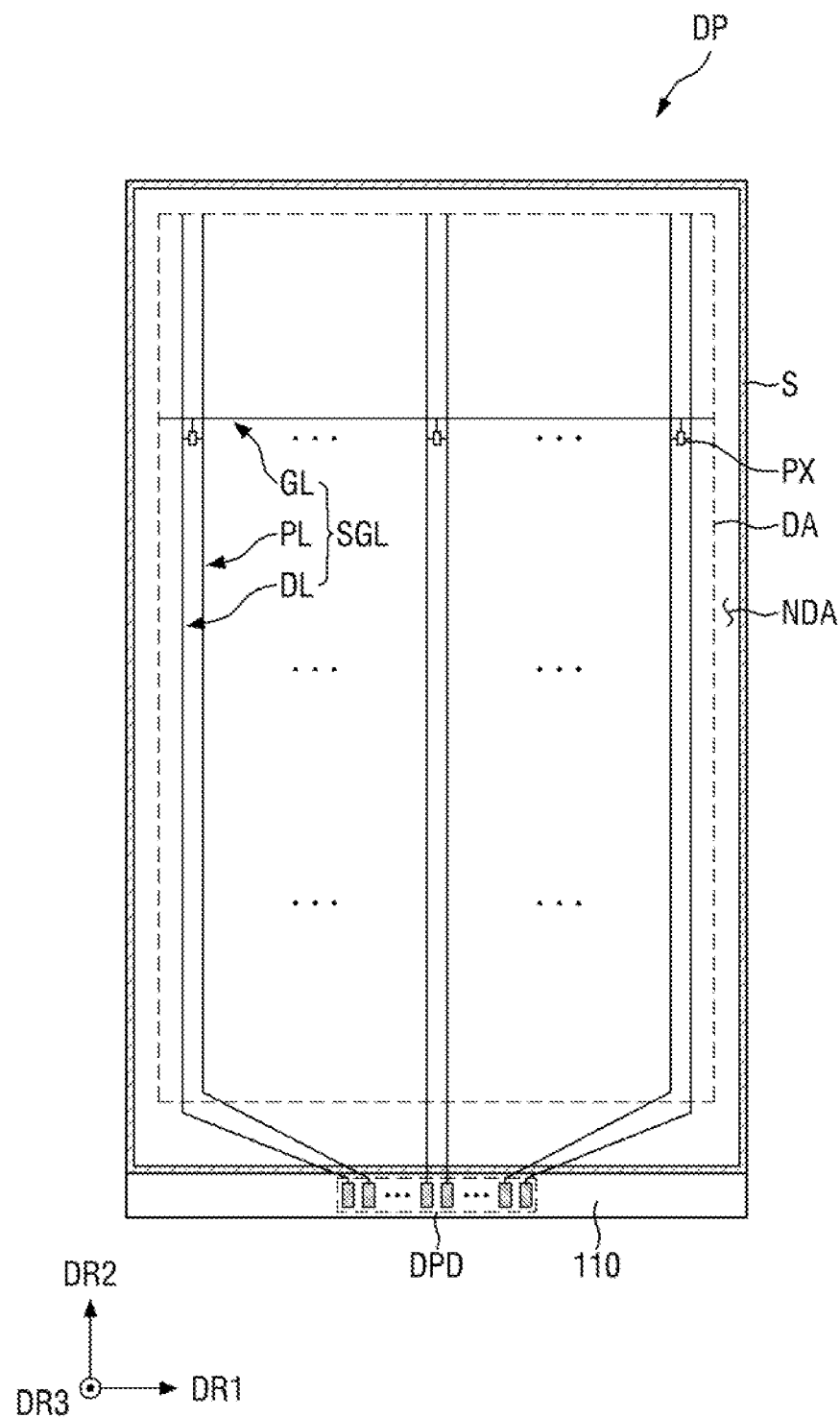
FIG. 4 is a schematic plan view illustrating a display panel according to an exemplary embodiment of the present disclosure.
Figure 5:
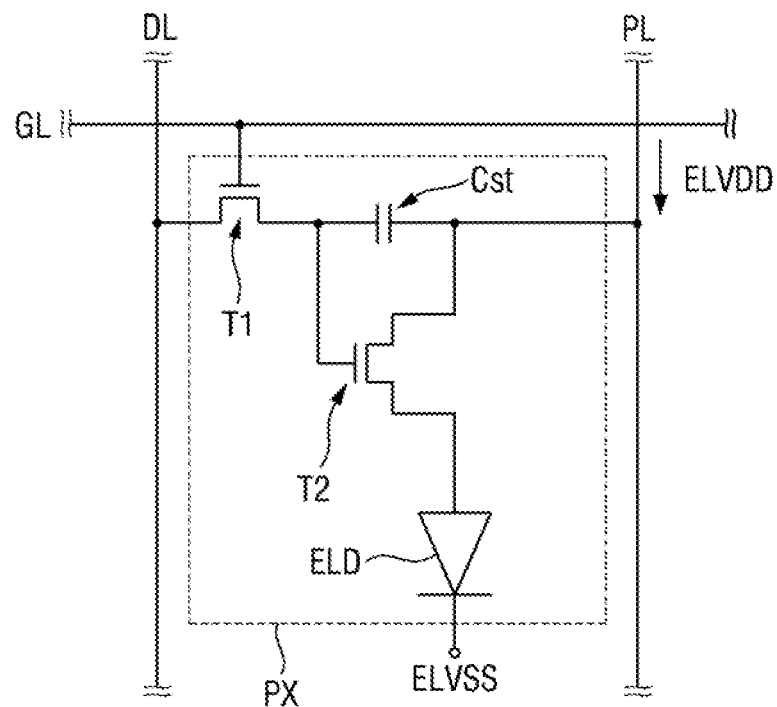
FIG. 5 is an exemplary equivalent circuit diagram illustrating a pixel shown in FIG. 4.
Figure 6:
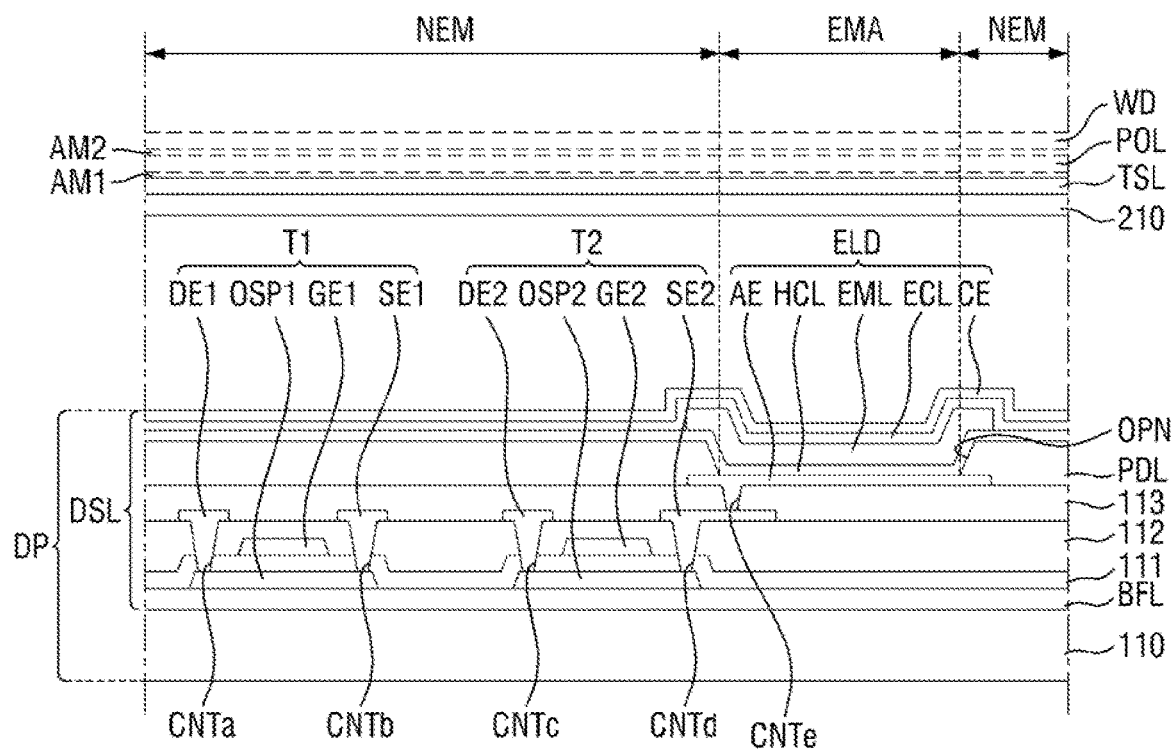
FIG. 6 is a schematic cross-sectional view illustrating a pixel shown in FIG. 5.

FIG. 4 is a schematic plan view illustrating a display panel according to an exemplary embodiment of the present disclosure, FIG. 5 is an exemplary equivalent circuit diagram of a pixel illustrated in FIG. 4, and FIG. 6 is a schematic cross-sectional view of a pixel illustrated in FIG. 5.

Referring to FIG. 4, a plurality of signal lines SGL may be disposed on the first substrate 110 in the display area DA of the display panel DP, and a signal pad portion DPD may be disposed on the first substrate 110 in the non-display area NDA. The display area DA may include a plurality of pixels PX. The sealing material S, which completely surrounds the display area DA, may be disposed on the first substrate 110 in the non-display area NDA.

The signal lines SGL and the signal pad portion DPD may be included in the element layer DSL.

The signal lines SGL may include scan lines GL, data lines DL, and power lines PL. Each scan line GL is connected to the plurality of pixels PX and transmits a scan signal to the corresponding pixels PX. Each data line DL is connected to the plurality of pixels PX and transmits a data signal to the corresponding pixels PX. The power line PL is connected to the plurality of pixels PX and transmits a driving voltage to each pixel PX.

The signal pad portion DPD may be disposed in the non-display area NDA and connected to the signal lines SGL such as the data lines DL. The signal pad portion DPD may receive a data signal from an external element, e.g., a panel driving circuit which drives the display panel DP.

In an exemplary embodiment of the present disclosure, each scan line may extend primarily in the first direction DR1 and each data line DL may extend primarily in the second direction DR2. In some exemplary embodiments of the present disclosure, the power line PL may extend primarily in the second direction DR2 like the data line DL, but the present disclosure is not necessarily limited thereto.

Referring to FIG. 5, each pixel PX may include a light emitting element ELD. The light emitting element ELD may be an organic light emitting diode (OLED) as described above. However, the present disclosure is not necessarily limited thereto, and the light emitting element ELD may be any one of a quantum dot light emitting diode, an inorganic matter-based micro light emitting diode, and an inorganic matter-based nano light emitting diode. The light emitting element ELD may be a front-emitting type diode or a back-emitting type diode.

Each pixel PX may further include, as a pixel driving circuit for driving the light emitting element ELD, a first transistor T1 (or a switching transistor), a second transistor T2 (or a driving transistor), and a capacitor Cst. A first source voltage ELVDD may be provided to the second transistor T2, and a second source voltage ELVSS may be provided to the light emitting element ELD. The second source voltage ELVSS may be a voltage lower than the first source voltage ELVDD.

The first transistor T1 outputs a data signal applied to the data line DL response to a scan signal applied to the scan line GL. The capacitor Cst charges a voltage corresponding to the data signal received from the first transistor T1. The second transistor T2 is connected to the light emitting element ELD. The second transistor T2 controls driving current flowing in the light emitting element ELD corresponding to a quantity of electric charge stored in the capacitor Cst.

The equivalent circuit of FIG. 5 is merely an embodiment, and the present disclosure is not necessarily limited thereto. Each pixel PX may include three or more transistors and include a larger number of capacitors than what is shown and described herein.

In FIG. 6, a cross-section of a portion of the display panel DP corresponding to the equivalent circuit illustrated in FIG. 5 is illustrated, and the second substrate 210 and the touch sensor TSL are also illustrated together. Further, the polarizing film POL and the window WD are also illustrated together.

A buffer film BFL may be disposed on the first substrate 110.

A semiconductor pattern OSP1 (hereinafter referred to as "first semiconductor pattern OSP1") of the first transistor T1 and a semiconductor pattern OSP2 (hereinafter referred to as "second semiconductor pattern OSP2") of the second transistor T2 may be disposed on the buffer film BFL. Materials of the first semiconductor pattern OSP1 and the second semiconductor pattern OSP2 may be selected from the group consisting of amorphous silicon, polysilicon, and metal oxide semiconductor. In some exemplary embodiments of the present disclosure, any one of the first semiconductor pattern OSP1 and the second semiconductor pattern OSP2 may be formed of polysilicon, and the other one of the first semiconductor pattern OSP1 and the second semiconductor pattern OSP2 may be formed of metal oxide semiconductor.

A gate insulating film 111 is disposed on the first semiconductor pattern OSP1 and the second semiconductor pattern OSP2. A control electrode GE1 (hereinafter referred to as "first gate electrode GE1") of the first transistor T1 and a control electrode GE2 (hereinafter referred to as "second gate electrode GE2") of the second transistor T2 are disposed on the gate insulating film 111. When the first gate electrode GE1 and the second gate electrode GE2 are disposed on the same layer, the first gate electrode GE1 and the second gate electrode GE2 may be manufactured according to the same photolithography process as the scan lines GL (see FIG. 5). However, the present disclosure is not necessarily limited thereto, and the first gate electrode GE1 and the second gate electrode GE2 may be disposed on different layers. In such a case, only one of the first gate electrode GE1 and the second gate electrode GE2 may be manufactured according to the same photolithography process as the scan lines GL (see FIG. 5).

A second gate insulating film 112, which covers the first gate electrode GE1, and the second gate electrode GE2 are disposed on the gate insulating film 111. On the second gate insulating film 112, a drain electrode DE1 (hereinafter referred to as "first drain electrode DE1") and a source electrode SE1 (hereinafter referred to as "first source electrode SE1") of the first transistor T1 and a drain electrode DE2 (hereinafter referred to as "second drain electrode DE2") and a source electrode SE2 (hereinafter referred to as "second source electrode SE2") of the second transistor T2 are disposed.

The first drain electrode DE1 and the first source electrode SE1 are connected to the first semiconductor pattern OSP1 through an input contact hole CNTa and an output contact hole CNTb which pass through the gate insulating film 111 and the second gate insulating film 112. The second drain electrode DE2 and the second source electrode SE2 are connected to the second semiconductor pattern OSP2 through an input contact hole CNTc and an output contact hole CNTd which pass through the gate insulating film 111 and the second gate insulating film 112. In an exemplary embodiment of the present disclosure, one of the first transistor T1 and the second transistor T2 may be modified to have a bottom gate structure.

An intermediate organic film 113, which covers the first drain electrode DE1, the second drain electrode DE2, the source electrode SE1, and the second source electrode SE2 is disposed on the second gate insulating film 112. The intermediate organic film may provide a planar surface.

A pixel defining film PDL and the light emitting element ELD may be disposed on the intermediate organic film 113. The pixel defining film PDL may include an organic material. An anode electrode AE is disposed on the intermediate organic film 113. The anode electrode AE is connected to the second source electrode SE2 through an anode contact hole CNT3 passing through the intermediate organic film 113. An opening OPN is defined in the pixel defining film PDL. The opening OPN of the pixel defining film PDL exposes at least a portion of the anode electrode AE.

The pixel PX of the display area DA may include a light emitting area EMA and a non-light emitting area NEM adjacent to the light emitting area EMA. The non-light emitting area NEM may at least partially surround the tight emitting area EMA. In the present embodiment, the light emitting area EMA is defined corresponding to a partial area of the anode electrode AE exposed by the opening OPN.

A hole injection/transport layer HCL may be disposed in common in the light emitting area EMA and the non-light emitting area NEM. The hole injection/transport layer HCL may be formed in common in the pixels PX, but the present disclosure is not necessarily limited thereto.

A light emitting layer EML is disposed on the hole injection/transport layer HCL. The light emitting layer EML may generate light of a predetermined color. The light emitting layer EML may be disposed in an area corresponding to the opening OPN. For example, the light emitting layer EML may be separately formed in each of the pixels PX.

When the light emitting element ELD is an organic light emitting element, the light emitting layer EML may include an organic material. For example, in some exemplary embodiments of the present disclosure, the light emitting layer EML may be an organic light emitting layer.

In the present embodiment a patterned light emitting layer EML is illustrated as an example, but the light emitting layer EML may also be disposed in common in the pixels PX. In this case, the light emitting layer EML may generate white light. In some exemplary embodiments of the present disclosure, the light emitting layer EML may haw a multi-layer structure referred to as "tandem structure."

An electron injection/transport layer ECL is disposed on the light emitting layer EML. The electron injection/transport layer ECL may be formed in common in the pixels PX, but the present disclosure is not necessarily limited thereto.

A cathode electrode CE is disposed on the electron injection/transport layer ECL. The cathode electrode CE is disposed in common in the pixels PX.

The second substrate 210 may be disposed on the cathode electrode CE, and the cathode electrode CE and the second substrate 210 may be spaced apart from each other. The above-described touch sensor TSL may be disposed on the second substrate 210.

The anode electrode AE, the hole injection/transport layer HCL, the light emitting layer EML, the electron injection/transport layer ECL, and the cathode electrode CE, which are disposed in the light emitting area EMA may constitute the light emitting element ELD.

Figure 7:
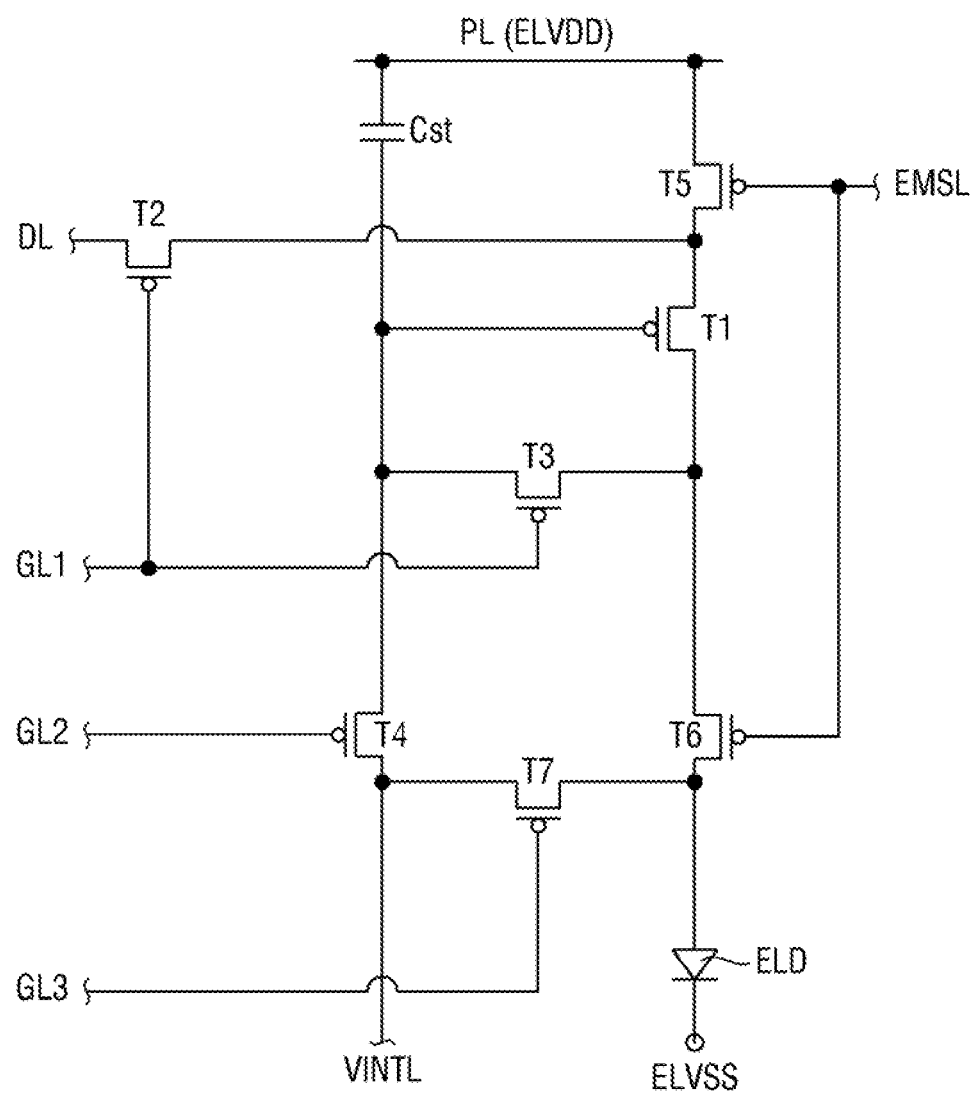
FIG. 7 is an equivalent circuit diagram illustrating a modified example of the pixel shown in FIG. 4.

FIG. 7 is an equivalent circuit diagram according to a modified example of the pixel illustrated in FIG. 4.

Referring to FIG. 7, each pixel may include a light emitting element ELD, a plurality of transistors T1 to T7, and a capacitor Cst. The capacitor Cst may include a first electrode and a second electrode.

Each of the transistors T1 to T7 includes a gate electrode, a first electrode, and a second electrode. Any one of the first electrode and the second electrode of each of the transistors T1 to T7 is a source electrode, and the other one thereof is a drain electrode.

The gate electrode of the first transistor T1 is connected to the first electrode of the capacitor Cst. The first electrode of the first transistor T1 is connected to the power line PL, which provides the first source voltage ELVDD, via the fifth transistor T5. The second electrode of the first transistor T1 is connected to the anode electrode of the light emitting element ELD via the sixth transistor T6. The first transistor T1 receives a data signal according to a switching operation of the second transistor T2 and supplies driving current to the light emitting element ELD.

The gate electrode of the second transistor T2 is connected to a first scan line GL1 to which a first scan signal is provided. The first electrode of the second transistor T2 is connected to a data line DL to which a data signal is provided. The second electrode of the second transistor T2 is connected to the power line PL, to which the first source voltage ELVDD is provided, via the fifth transistor T5 while being connected to the first electrode of the first transistor T1. The second transistor T2 is turned on according to the first scan signal and performs a switching operation in which a data signal is transmitted to the first electrode of the first transistor T1.

The gate electrode of the third transistor T3 is connected to the first scan line GL1 to which the first scan signal is provided. The first electrode of the third transistor T3 is connected to the anode electrode of the light emitting element ELD via the sixth transistor T6 while being connected to the second electrode of the first transistor T1. The second electrode of the third transistor T3 is simultaneously connected to the first electrode of the capacitor Cst, the first electrode of the fourth transistor T4, and the gate electrode of the first transistor T1. The third transistor T3 is turned on according to the first scan signal and connects the gate electrode and the second electrode of the first transistor T1 to each other so that the first transistor T1 is diode-connected. Accordingly, a voltage difference occurs, as much as a threshold voltage of the first transistor T1, between the first electrode and the gate electrode of the first transistor T1, and variations in the threshold voltage of the first transistor T1 may be compensated for by supplying a data signal, which is compensated for by the threshold voltage, to the gate electrode of the first transistor T1.

The gate electrode of the fourth transistor T4 is connected to a second scan line GL2 to which a second scan signal is provided. The second electrode of the fourth transistor T4 is connected to an initialization voltage line VINTL to which an initialization voltage is provided. The first electrode of the fourth transistor T4 is simultaneously connected to the first electrode of the capacitor Cst, the second electrode of the third transistor T3, and the gate electrode of the first transistor T1. The fourth transistor T4 is turned on according to the second scan signal and performs an operation in which the initialization voltage is transmitted to the gate electrode of the first transistor T1 to initialize the voltage of the gate electrode of the first transistor T1.

The gate electrode of the fifth transistor T5 is connected to a light emission control line EMSL to which a light emission control signal is provided. The first electrode of the fifth transistor T5 is connected to the power line PL to which the first source voltage is provided. The second electrode of the fifth transistor T5 is connected to the first electrode of the first transistor T1 and the second electrode of the second transistor T2.

The gate electrode of the sixth transistor T6 is connected to the light emission control line EMSL to which the light emission control signal is provided. The first electrode of the sixth transistor T6 is connected to the second electrode of the first transistor T1 and the first electrode of the third transistor T3. The second electrode of the sixth transistor T6 is connected to the anode electrode of the light emitting element ELD.

The fifth transistor T5 and the sixth transistor T6 are simultaneously turned on according to the light emission control signal and accordingly, driving current flows in the light emitting element ELD.

The gate electrode of the seventh transistor T7 is connected to a third scan line GL3 which provides a third scan signal. The first electrode of the seventh transistor T7 is connected to the anode electrode of the light emitting element ELD. The second electrode of the seventh transistor T7 is connected to the initialization voltage line VINTL. The seventh transistor T7 is turned on according to the third scan signal and initializes the anode electrode of the light emitting element ELD.

The second electrode of the capacitor Cst is connected to the power line PL. The first electrode of the capacitor Cst is simultaneously connected to the gate electrode of the first transistor T1, the second electrode of the third transistor T3, and the first electrode of the fourth transistor T4. The second source voltage ELVSS may be provided to the cathode electrode of the light emitting element ELD.

The light emitting element ELD receives driving current from the first transistor T1 and emits light so that an image is displayed.

Figure 8:
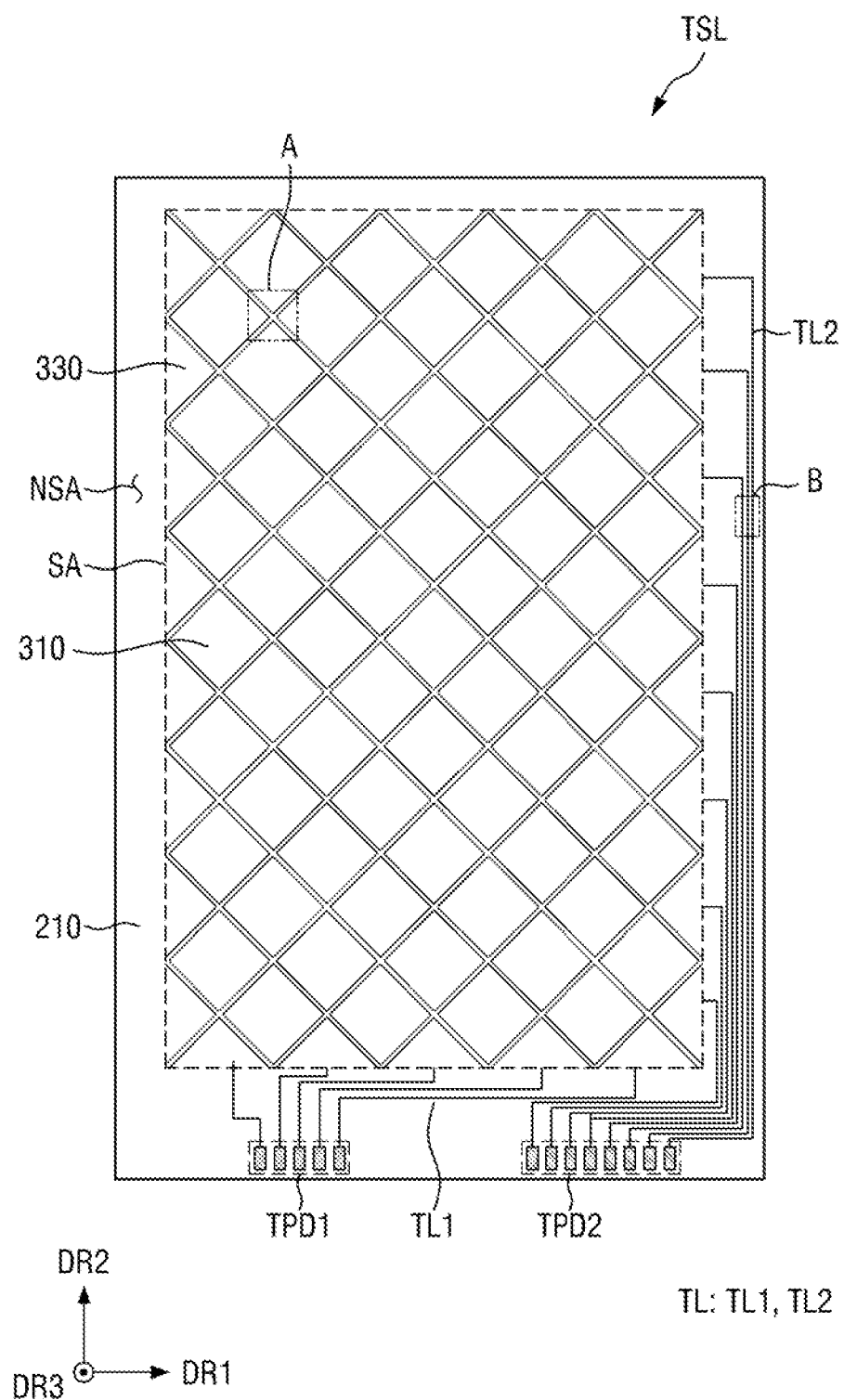
FIG. 8 is a plan view illustrating a touch sensor according to an exemplary embodiment of the present disclosure.
Figure 9:
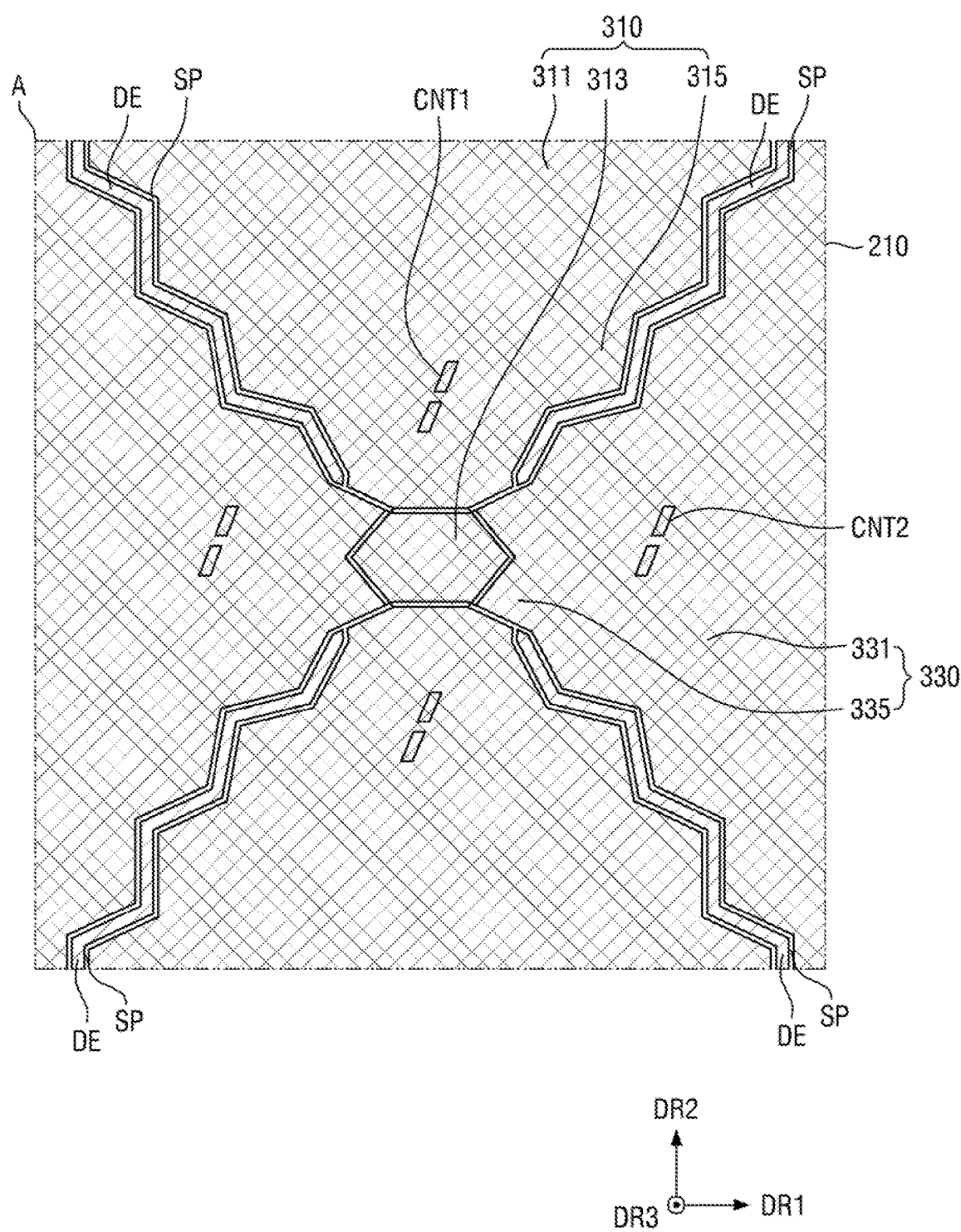
FIG. 9 is an enlarged plan view illustrating area A of FIG. 8.
Figure 10:
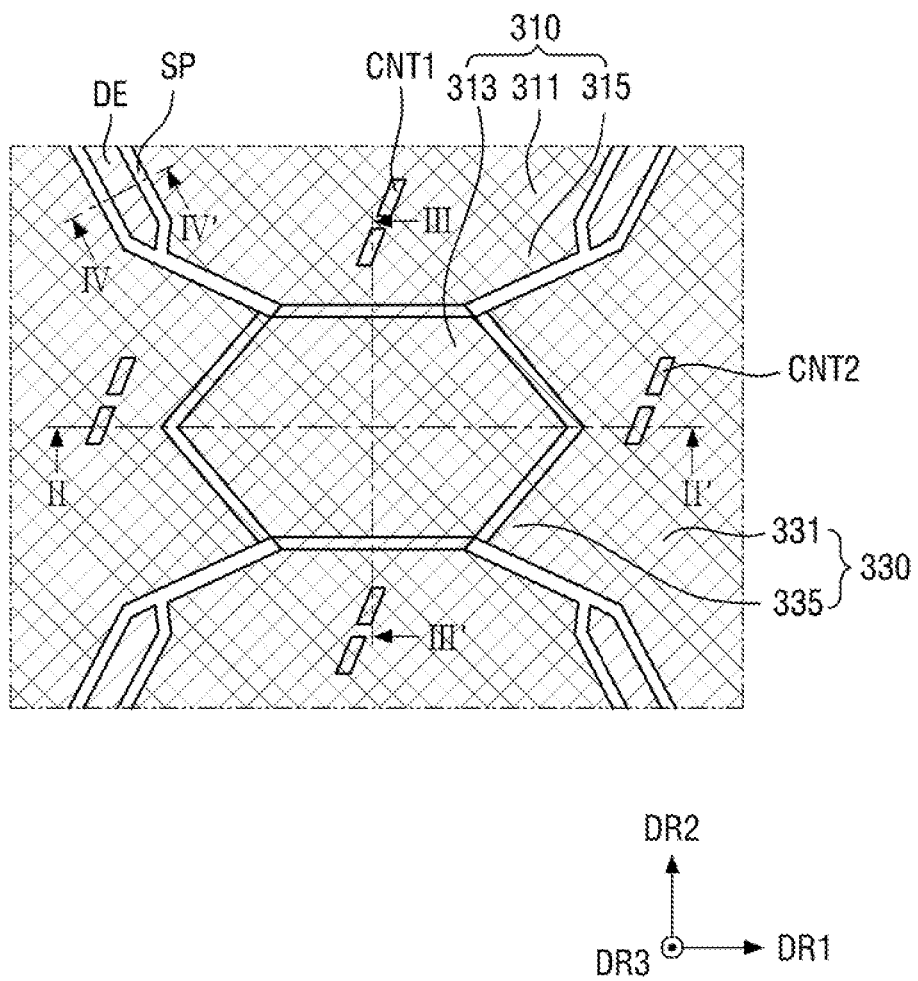
FIG. 10 is an enlarged view illustrating a portion of FIG. 9.

FIG. 8 is a plan view of a touch sensor according to an exemplary embodiment of the present disclosure. FIG. 9 is an enlarged plan view of area A of FIG. 8. FIG. 10 is an enlarged view of a portion of FIG. 9.

Referring to FIG. 3 and FIGS. 8 to 10, as described above, the touch sensor TSL is disposed on the second substrate 210. For example, the second substrate 210 may serve as a base layer of the touch sensor TSL.

The sensing area SA and the non-sensing area NSA are defined in the touch sensor TSL. The sensing area SA is an area of the touch sensor TSL that senses a touch input. The non-sensing area NSA does not directly sense a touch input, but may serve to prevent coupling between touch signal lines connected to electrode portions sensing a touch input and prevent the touch signal lines from being disconnected due to static electricity. For example, a touch ground wire adjacent to the touch signal lines, a touch static electricity preventing wire adjacent to the touch signal lines, and the like may be disposed in the non-sensing area NSA and serve to assist in sensing a touch input by the sensing area SA.

The sensing area SA may correspond to the display area DA of the display device 1 illustrated in FIG. 1 or the display area DA of the display panel DP illustrated in FIG. 4. Also, the non-sensing area NSA may correspond to the non-display area NDA of the display device 1 illustrated in FIG. 1 or the non-display area NDA of the display panel DP illustrated in FIG. 4. In some exemplary embodiments of the present disclosure, the sensing area SA may he substantially the same as the display area DA of the display panel DP, and the non-sensing area. NSA may be substantially the same as the non-display area NDA of the display panel DP.

The touch sensor TSL may include a first electrode portion 310 and a second electrode portion 330 and may further include touch signal lines TL1 and TL2 and touch pad portions TPD1 and TPD2.

The first electrode portion 310 and the second electrode portion 330 may be disposed in the sensing area SA, and the touch pad portions TPD1 and TPD2 and the touch signal lines TL1 and TL2 may be disposed in the non-sensing area NSA. One end of the first touch signal line TL1 may be connected to the first electrode portion 310, the other end of the first touch signal line TL1 may be connected to the first touch pad portion TPD1, one end of the second touch signal line TL2 may be connected to the second electrode portion 330, and the other end of the second touch signal line TL2 may be connected to the second touch pad portion TPD2. The first touch signal line TL1 may be provided as a plurality of first touch signal lines TL1, and the second touch signal line TL2 may be provided as a plurality of second touch signal line TL2.

Hereinafter, the sensing area SA will be described in more detail.

The first electrode portion 310 and the second electrode portion 330 insulated from the first electrode portion 310 may be disposed on the second substrate 210. Any one of the first electrode portion 310 and the second electrode portion 330 may be a driving electrode, and the other one thereof may be a sensing electrode. In the present embodiment, a case in which the first electrode portion 310 is a driving electrode and the second electrode portion 330 is a sensing electrode will be described as an example. When the first electrode portion 310 is a driving electrode and the second electrode portion 330 is a sensing electrode, the first touch signal line TL1 connected to the first electrode portion 310 may be a touch driving signal line, and the second touch signal line TL2 connected to the second electrode portion 330 may be a touch sensing signal line. Likewise, the first touch pad portion TPD1 connected to the first touch signal line TL1 may be a touch driving pad portion, and the second touch pad portion TPD2 connected to the second touch signal line TL2 may be a touch sensing pad portion.

The first electrode portion 310 may extend primarily in the second direction DR2. The first electrode portion 310 may be provided as a plurality of first electrode portions 310, and the plurality of first electrode portions 310 may be spaced apart from each other in the first direction DR1. Each first electrode portion 310 may include a plurality of first sub-sensing electrodes 311 spaced apart from each other in the second direction DR2, a connecting portion 313 which physically connects the first sub-sensing electrodes 311 adjacent to each other, and a third sub-sensing electrode 315 disposed on the first sub-sensing electrodes 311 and electrically connected to the first sub-sensing electrodes 311. The first sub-sensing electrodes 311 of the first electrode portion 310 and the connecting portion 313, which connects the first sub-sensing electrodes 311 adjacent to each other, may have a linear shape extending primarily in the second direction DR2.

The second electrode portion 330 may extend primarily in the first direction DR1. The second electrode portion 330 may be provided as a plurality of second electrode portions 330, and the plurality of second electrode portions 330 may be spaced apart from each other in the second direction DR2. The second electrode portion 330 may be electrically insulated from the first electrode portion 310. Each second electrode portion 330 may include a plurality of second sub-sensing electrodes 331 spaced apart from each other in the first direction DR1, and a fourth sub-sensing electrode 335 electrically connected to the second sub-sensing electrodes 331. The second sub-sensing electrode 331 may be spaced apart from the first sub-sensing electrode 311 adjacent thereto with a predetermined separation space SP disposed therebetween and be electrically insulated from the first sub-sensing electrode 311. Meanwhile, although the plurality of first sub-sensing electrodes 311 spaced apart from each other in the second direction DR2 are electrically connected by the connecting portion 313 disposed in the same layer (the first conductive layer ML1) and form a linear shape, since, as described above, the plurality of second sub-sensing electrodes 331, which are disposed in the same layer as the first sub-sensing electrodes 311 and spaced apart from each other in the first direction DR1, are insulated from the first electrode portion 310, the second sub-sensing electrodes 331 adjacent to each other may be electrically connected through the fourth sub-sensing electrode 335 disposed in a layer (the third conductive layer ML3) that is different from the first conductive layer ML1 in which the first sub-sensing electrodes 311, the second sub-sensing electrodes 331, and the connecting portion 313 are disposed. The fourth sub-sensing electrode 335 may be spaced apart from the third sub-sensing electrode 315 adjacent thereto with a predetermined separation space SP disposed therebetween and be electrically insulated from the third sub-sensing electrode 315.

The first sub-sensing electrodes 311, the connecting portion 313, and the second sub-sensing electrode 315 of the first electrode portion 310 may firm a planar pattern, and the second sub-sensing electrodes 331 and the fourth sub-sensing electrode 335 of the second electrode portion 330 may form a planar pattern.

At least some of the first sub-sensing electrodes 311 and the second sub-sensing electrodes 331 may have a substantially rhombic shape. Some of the first sub-sensing electrodes 311 and the second sub-sensing electrodes 331 may have a shape obtained by cutting a rhombic shape (e.g. a rhombic section shape). For example, all the first sub-sensing electrodes 311 and the second sub-sensing electrodes 331 except for those disposed at both end portions in an extending direction may have a rhombic shape, and the first sub-sensing electrodes 311 and the second sub-sensing electrodes 331 disposed at the both end portions in the extending direction may have a triangular shape obtained by cutting a rhombic shape in half.

In the present specification, the "rhombic shape" or "substantially rhombic shape" not only includes a shape formed by connecting four line segments, each having a completely linear shape, extending in arbitrary directions, but also includes a shape formed by connecting curves or concave and convex portions, as long as line segments formed by roughly connecting the curves or concave and convex portions constitute a rhombic shape.

For example, as illustrated in FIGS. 9 and 10, concave and convex portions may be formed in at least some sections of the line segments constituting a rhombic shape of the first sub-sensing electrodes 311 and the second sub-sensing electrodes 331. The line segments opposing each other of the first sub-sensing electrodes 311 and the second sub-sensing electrodes 331 may each include concave and convex portions, and the opposing line segments including the concave and convex portions may extend while maintaining the same separation distance therebetween. For example, when a line segment of the first sub-sensing electrode 311 includes a convex portion, a concave portion, and a convex portion in that order, correspondingly, a line segment of the second sub-sensing electrode 331 adjacent thereto opposing the line segment of first sub-sensing electrode 311 may include a concave portion, a convex portion, and a concave portion in that order. A separation space SP between the first sub-sensing electrode 311 and the second sub-sensing electrode 331 whose opposing line segments include the concave and convex portions may have a zigzag shape.

Since concave and convex portions are formed in at least some sections of the line segments constituting a rhombic shape of the first sub-sensing electrodes 311 and the second sub-sensing electrodes 331 when a user views an image on the display device 1, the Moire phenomenon due to the first sub-sensing electrodes 311 and the second sub-sensing electrodes 331 may be prevented.

The sizes and shapes of the first sub-sensing electrodes 311 each having a rhombic shape and the second sub-sensing electrodes 331 each having a rhombic shape may be substantially the same as each other. The sizes and shapes of the first sub-sensing electrodes 311 each having a triangular shape and the second, sub-sensing, electrodes 331 each having a triangular shape may be substantially the same as each other. However, the invention is not necessarily limited to the exemplary embodiments thereof described above, and the shapes and sizes of the first sub-sensing electrodes 311 and the second sub-sensing electrodes 331 may be modified in various ways. For example, the shapes of the first sub-sensing electrodes 311 and the second sub-sensing electrodes 331 may be modified to various shapes such as a quadrilateral shape, a pentagonal shape, a circular shape, and a bar shape.

Dummy electrodes DE may be further disposed in the separation space SP between the first sub-sensing electrodes 311 and the second sub-sensing electrodes 331. The dummy electrodes DE may be disposed in the first conductive layer ML1. For example, the first conductive layer ML1 may further include the dummy electrodes DE disposed in the separation space SP between the first sub-sensing electrodes 311 and the second sub-sensing electrodes 331. When the first sub-sensing electrodes 311 and the second sub-sensing electrodes 331 are disposed too close to each other, too large a cap is formed. Therefore, the first sub-sensing electrodes 311 and the second sub-sensing electrodes 331 may be spaced apart from each other by the above-described separation space SP therebetween. Meanwhile, in the separation space SP, a conductive layer is not disposed, and the insulating layer ILD is exposed through the top. Due to a refractive index difference between the exposed insulating layer ILD and the conductive layers adjacent thereto, a pattern may be recognized from the outside. Thus, by arranging the dummy electrodes DE in the separation space SP, the extent to which the pattern is recognized may be decreased.

The dummy electrodes DE may be floating electrodes that are physically spaced apart from and not electrically connected to the sub-sensing electrodes 311 and 331 adjacent thereto.

A width of the dummy electrodes IDE may be smaller than a width of the separation space SP, and the dummy electrodes DE may have substantially the same shape as the separation space SP between the first sub-sensing electrodes 311 and the second sub-sensing electrodes 331. In FIG. 9, the dummy electrodes DE are illustrated as being formed as a pattern extending primarily in directions in which the opposing line segments of the first sub-sensing electrodes 311 and the second sub-sensing electrodes 331 extend. However, the present disclosure is not necessarily limited thereto, and the dummy electrodes DE may also be formed as a plurality of patterns spaced apart in the extending directions.

The third sub-sensing electrode 315 may at least partially overlap the first sub-sensing electrodes 311 in a thickness direction. The third sub-sensing electrode 315 of the first electrode portion 310 may be provided as a plurality of third sub-sensing electrodes 315. Like the arrangement of the plurality of first sub-sensing electrodes 311, the plurality of third sub-sensing electrodes 315 of the first electrode portion 310 may be spaced apart from each other in the second direction DR2. The third sub-sensing electrodes 315 might not overlap the connecting portion 313 of the first electrode portion 310. In the plan view, the third sub-sensing electrodes 315 adjacent to each other in the second direction DR2 may be spaced apart from each other with the connecting portion 313 disposed therebetween. In some exemplary embodiments of the present disclosure, the third sub-sensing electrodes 315 may partially overlap the connecting portion 313 of the first electrode portion 310, but even in this case, the third sub-sensing electrodes 315 are spaced apart from the fourth sub-sensing electrode 335.

In the plan view, the insulating layer ILD may include a first contact hole CNT1 at least partially overlapping the third sub-sensing electrodes 315. The third sub-sensing electrodes 315 and the first sub-sensing electrodes 311 at least partially overlapping each other may be electrically connected through the first contact hole CNT1. In this way, the overall resistance of the first electrode portion 310 may be lowered. Although, in the drawings, two first contact holes CNT1 are illustrated as overlapping a single third sub-sensing electrode 315, the number of first contact holes CNT1 corresponding to the single third sub-sensing electrode 315 is not necessarily limited thereto, and there may be one first contact hole CNT1 or three or more first contact holes CNT1.

The shape of the third sub-sensing electrode 315 may be substantially the same as the shape of the first sub-sensing electrode 311. For example, at least some of the third sub-sensing, electrodes 315 may have a substantially rhombic shape.

Some third sub-sensing electrodes 315 may have a shape obtained by cutting a rhombic shape (e.g. a rhombic section). For example, all the third sub-sensing electrodes 315, except for those disposed at both end portions in an extending direction, may have a rhombic shape, and the third sub-sensing electrodes 315 disposed at the both end portions in the extending direction may have a triangular shape obtained by cutting a rhombic shape in half.

The sizes and shapes of the first sub-sensing electrodes 311, each having a rhombic shape, and the third sub-sensing electrodes 315, each having a rhombic shape, may be substantially the same as each other. The sizes and shapes of the first sub-sensing electrodes 311, each having a triangular shape, and the third sub-sensing electrodes 315, each having a triangular shape, may be substantially the same as each other. Further, like the shape of the first sub-sensing electrodes 311 overlapping the third sub-sensing electrodes 315 in the thickness direction, concave and convex portions may be formed in at least some sections of the line segments constituting the rhombic shape or triangular shape of the third sub-sensing electrodes 315. The rhombic shape or triangular shape of the third sub-sensing electrodes 315 formed by the line segments in which the concave and convex portions are formed in at least some section may be the same as the shape of the first sub-sensing electrodes 311 disposed to overlap the third sub-sensing electrodes 315 in the thickness direction. For example, a planar profile of the first sub-sensing electrodes 311 corresponding to the third sub-sensing electrodes 315 in the thickness direction may be completely the same as a planar profile of the third sub-sensing electrodes 315.

The fourth sub-sensing electrode 335 may at least partially overlap the second sub-sensing electrodes 331 and the separation space between the second sub-sensing electrodes 331 adjacent to each other in the thickness direction. The fourth sub-sensing electrode 335 of the second electrode portion 330 may have a linear shape extending primarily in the first direction DR1.

The fourth sub-sensing electrode 335 may at least partially overlap the connecting portion 313 of the first electrode portion 310. Because, as described above, the fourth sub-sensing electrode 335 is disposed in the third conductive layer ML3 which is different from the first conductive layer ML1 in which the connecting portion 313 is disposed, even when the fourth sub-sensing electrode 335 overlap the connecting portion 113 of the first electrode portion 310, the fourth sub-sensing electrode 335 may be electrically insulated. The fourth sub-sensing electrode 335 may be spaced apart from the third sub-sensing electrodes 315, which are disposed in the same layer (the third conductive layer ML3) as the fourth sub-sensing electrode 335, with the separation space SP disposed therebetween.

The insulating layer ILD may further include a second contact hole CNT2 disposed to overlap the fourth sub-sensing electrode 335 in the plan view. The fourth sub-sensing electrode 335 and the second sub-sensing electrodes 331 overlapping each other may be electrically connected through the second contact hole CNT2. In this way, the overall resistance of the second electrode portion 330 may be lowered. Although, in the drawings, two second contact holes CNT2 are illustrated as corresponding to a single second sub-sensing electrode 331, the number of second contact holes CNT2 corresponding to the single second sub-sensing electrode 331 is not necessarily limited thereto, and there may be one second contact hole CNT2 or three or more second contact holes CNT2.

The shape of the fourth sub-sensing electrode 335 may be substantially the same as the linear shape extending primarily in the second direction DR2 in which the plurality of first sub-sensing electrodes 311 of the first electrode portion 310, which are disposed in the second direction DR2, and the connecting portion 313, which connects the first sub-sensing electrodes 311, are connected, except that the linear shape of the fourth sub-sensing electrode 335 extends primarily in the first direction DR1.

Further, like the shape of the second sub-sensing electrodes 331 overlapping the fourth sub-sensing electrode 335 in the thickness direction, concave and convex portions may be formed in at least some sections of the line segments constituting the rhombic shape or triangular shape of the fourth sub-sensing electrode 335. The rhombic shape or triangular shape of the fourth sub-sensing electrodes 335 formed by the line segments in which the concave and convex portions are formed in at least some section may be the same as the shape of the second sub-sensing electrodes 335 overlap the fourth sub-sensing electrode 335 in the thickness direction. For example, a planar profile of the second sub-sensing electrodes 331 corresponding to the fourth sub-sensing electrode 335 in the thickness direction may be completely the same as a planar profile of the fourth sub-sensing electrode 335.

Figure 11:
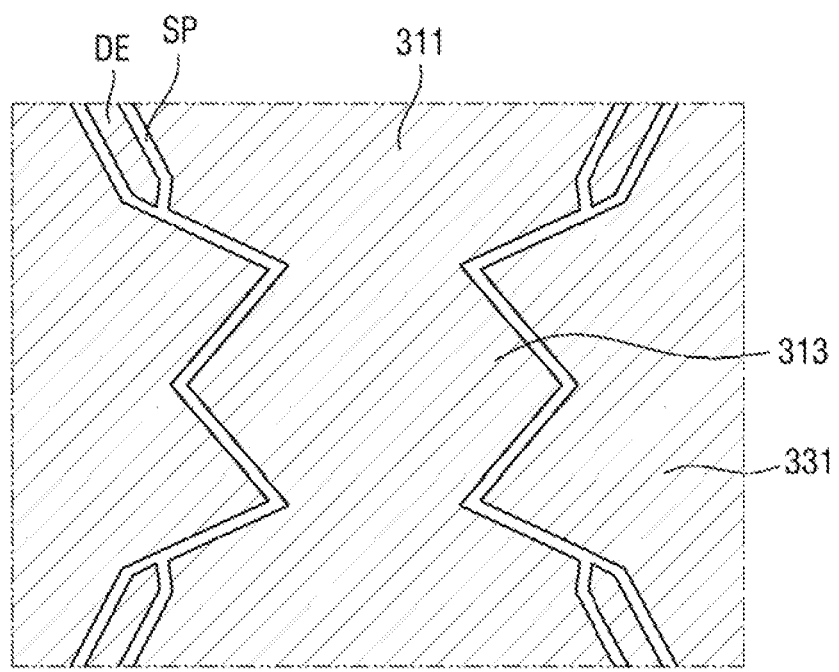
FIG. 11 is a view illustrating a first sub-sensing electrode, a second sub-sensing electrode, and a connecting portion of FIG. 10.
Figure 11:
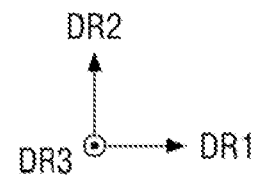
Figure 12:
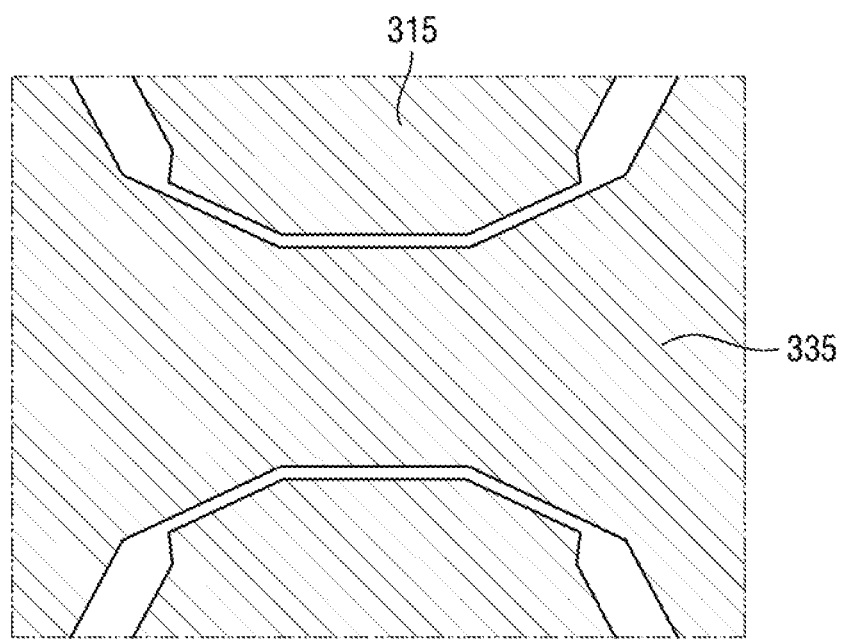
FIG. 12 is a view illustrating a third sub-sensing electrode and a fourth sub-sensing electrode of FIG. 10.
Figure 12:
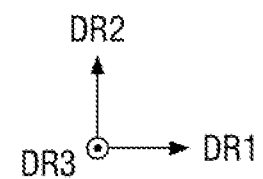

FIG. 11 is a view illustrating, a first sub-sensing electrode, a second sub-sensing electrode, and a connecting portion of FIG. 10, and FIG. 12 is a view illustrating a third sub-sensing electrode and a fourth sub-sensing electrode of FIG. 10.

Referring to FIG. 3 and FIGS. 11 and 12, as described above, the first sub-sensing electrodes 311, the connecting portion 313, the second sub-sensing electrodes 331, and the dummy electrode DE may be disposed in the first conductive layer ML1, and the third sub-sensing electrodes 315 and the fourth sub-sensing electrode 335 may be disposed in the third conductive layer ML3. The first sub-sensing electrodes 311 and the connecting portion 313 disposed in the first conductive layer ML1 may be insulated by being spaced apart from the second sub-sensing electrodes 331 and the dummy electrodes DE. The third sub-sensing electrodes 315 and the fourth sub-sensing electrode 335 disposed in the second conductive layer ML2 may be insulated by being spaced apart from each other.

Although the plurality of first sub-sensing electrodes 311 spaced apart from each other in the second direction DR2 are electrically connected by the connecting portion 313 disposed in the first conductive layer ML1, because the plurality of second sub-sensing electrodes 331, which are disposed in the same layer as the first sub-sensing electrodes 311 and spaced apart from each other in the first direction DR1, are insulated from the first electrode portion 310, the second sub-sensing electrodes 331 adjacent to each other may be electrically connected through the fourth sub-sensing electrode 335 disposed in the third conductive layer ML3.

The third sub-sensing electrodes 315 and the first sub-sensing electrodes 311 at least partially overlapping each other are electrically connected, and the fourth sub-sensing electrode 335 and the second sub-sensing electrodes 331 at least partially overlapping each other are electrically connected. Thus, the overall resistance of the electrode portions 310 and 330 may be lowered.

Figure 13:
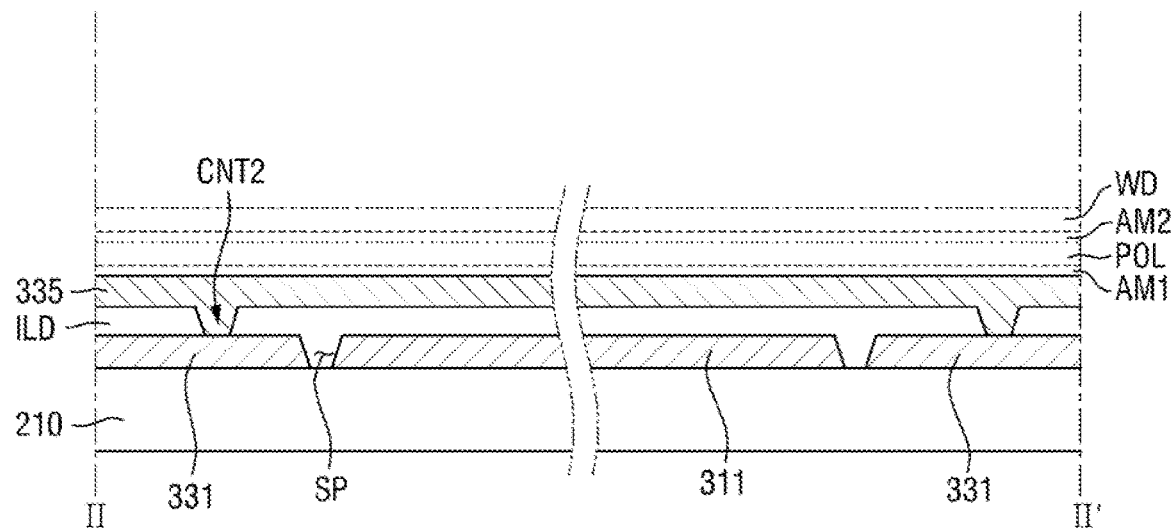
FIG. 13 is a cross-sectional view taken along line II-II' of FIG. 10.
Figure 14:
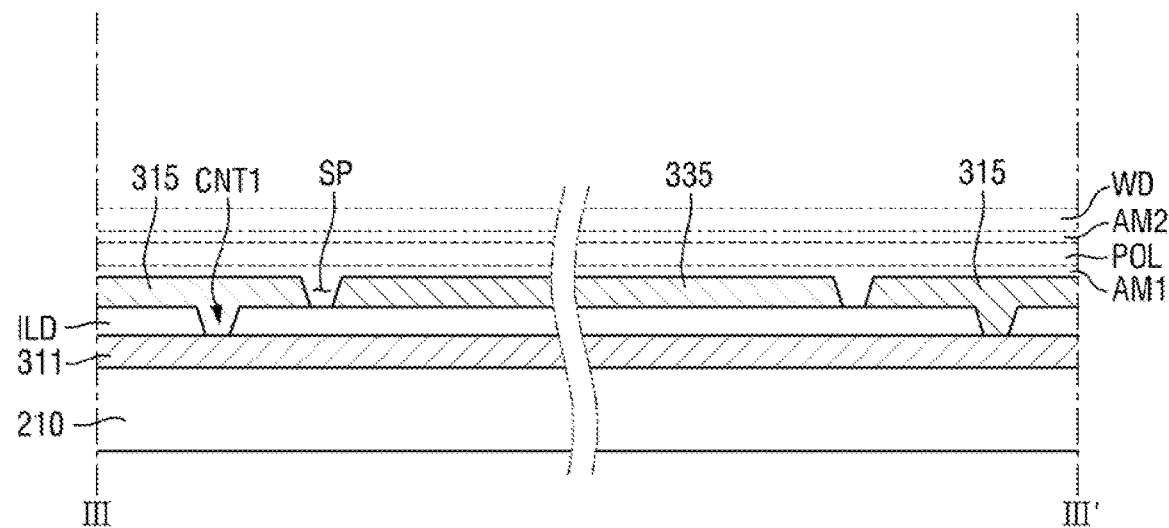
FIG. 14 is a cross-sectional view taken along line III-III' of FIG. 10.
Figure 15:
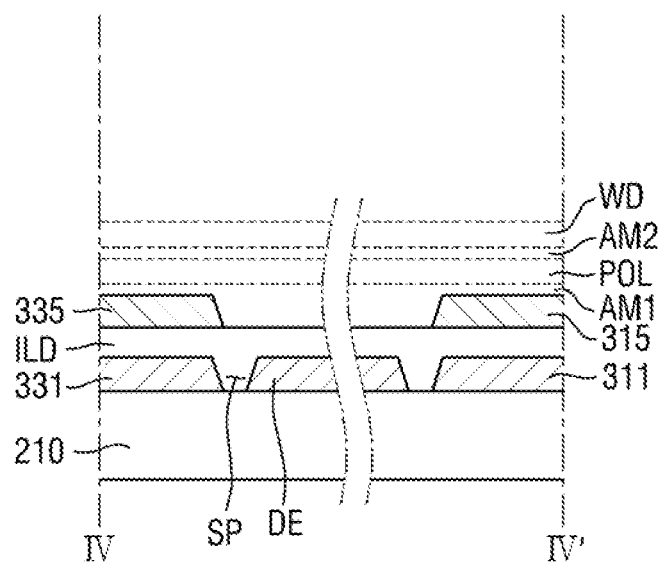
FIG. 15 is a cross-sectional view taken along line IV-IV' of FIG. 10.

FIG. 13 is a cross-sectional view taken along line II-II' of FIG. 10, FIG. 14 is a cross-sectional view taken along line III-III' of FIG. 10, and FIG. 15 is a cross-sectional view taken along line IV-IV' of FIG. 10. In FIGS. 13 to 15, the polarizing film POL disposed on the touch sensor TSL and the window WD disposed on the polarizing film POL are illustrated, and a first adhering member AM1 which adheres the polarizing film POL and the touch sensor TSL to each other and a second adhering member AM2 which adheres the polarizing film POL and the window WD to each other are further illustrated.

First, referring to FIG. 13, the first sub-sensing electrode 311 and the second sub-sensing electrode 331 may be disposed directly on the second substrate 210. The first sub-sensing electrode 311 and the second sub-sensing electrode 331 may be spaced apart from each other with the separation space SP disposed therebetween.

The insulating layer ILD may be disposed on the first sub-sensing electrode 311 and the second sub-sensing electrode 331. The insulating layer ILD may be disposed directly on upper surfaces of the first sub-sensing electrode 311 and the second sub-sensing electrode 331, and, in the separation space SP between the first sub-sensing electrode 311 and the second sub-sensing electrode 331, the insulating layer ILD may come into contact with side surfaces of the first sub-sensing electrode 311 and the second sub-sensing electrode 331 and come into direct contact with the second substrate 210, which is exposed.

The fourth sub-sensing electrode 335 may be disposed on the insulating layer ILD. The fourth sub-sensing electrode 335 may be disposed directly on the insulating layer ILD and electrically connected to the second sub-sensing electrode 331 through the second contact hole CNT2 of the insulating layer ILD.

The first adhering member AM1 may come into direct contact with the fourth sub-sensing electrode 335. In some exemplary embodiments of the present disclosure, the polarizing film POL and the first adhering member AM1 may be omitted. In this case, the second adhering member AM2, which is disposed at a lower portion of the window WD, may come into direct contact with the fourth sub-sensing electrode 335.

Referring to FIG. 14, the third sub-sensing electrode 315 may be disposed on the insulating layer ILD. The third sub-sensing electrode 315 may be disposed in the same layer as the fourth sub-sensing electrode 335. The third sub-sensing electrode 315 may be disposed directly on the insulating layer ILD. The third sub-sensing electrode 315 and the fourth sub-sensing electrode 335 may be spaced apart from each other with the separation space SP disposed therebetween. The third sub-sensing electrode 315 may be electrically connected to the first sub-sensing electrode 311 therebelow through the first contact hole CNT1 of the insulating layer ILD.

The first adhering member AM1 may come into direct contact with the fourth sub-sensing electrode 335 and the third sub-sensing electrode 315. The first adhering member AM1 may also be disposed in the separation space SP and come into direct contact with an upper surface of the insulating layer ILD that is exposed by the fourth sub-sensing electrode 335 and the third sub-sensing electrode 315. In some exemplary embodiments of the present disclosure, the polarizing film POL and the first adhering member AM1 may be omitted. In this case, the second adhering member AM2 disposed at the lower portion of the window WD may come into direct contact with the fourth sub-sensing electrode 335 and the third sub-sensing electrode 315. The second adhering member AM2 may also be disposed in the separation space SP and come into direct contact with the upper surface of the insulating layer ILD that is exposed by the fourth sub-sensing electrode 335 and the third sub-sensing electrode 315.

Referring to FIG. 15, the dummy electrodes DE may be disposed on the second substrate 210. The dummy electrodes DE may be disposed directly on the second substrate 210. The dummy electrodes DE may be disposed in the separation space SP between the first sub-sensing electrode 311 and the second sub-sensing electrode 331. The dummy electrodes DE may be spaced apart from each other with a predetermined separation space, which is a separation space between the first sub-sensing electrode 311 and the second sub-sensing electrode 331 adjacent to each other, disposed therebetween. The dummy electrodes DE may be disposed in the same layer as the first sub-sensing electrode 311 and the second sub-sensing electrode 331.

The insulating layer ILD may be disposed on the dummy electrode DE. The insulating layer ILD may come into direct contact with an upper surface of the dummy electrode DE and may be further disposed sin the separation space between the sub-sensing electrodes 311 and 331 that is adjacent to the dummy electrode DE, fill the separation space, come into contact with a side surface of the dummy electrode DE and the side surfaces of the sub-sensing electrodes 311 and 331, and directly come into contact with an upper surface of the second substrate 210 which is exposed in the corresponding area.

The third sub-sensing electrode 315 and the fourth sub-sensing electrode 335 may be spaced apart from each other with the separation space SP disposed therebetween. A width of the separation space SP between the third sub-sensing electrode 315 and the fourth sub-sensing electrode 335 may be the same as a width of the separation space SP between the first sub-sensing electrode 311 and the second sub-sensing electrode 331. For example, inner side surfaces of the third sub-sensing electrode 315 and the fourth sub-sensing electrode 335 may be aligned in the thickness direction with inner side surfaces of the first sub-sensing electrode 311 and the second sub-sensing electrode 331 therebelow. The third sub-sensing electrode 315 and the fourth sub-sensing electrode 335 might not overlap the dummy electrode DE in the thickness direction.

The first adhering member AM1 may come into direct contact with the fourth sub-sensing electrode 335 and the third sub-sensing electrode 315. The first adhering member AM1 may come into direct contact with the upper surface of the insulating layer ILD that is exposed by the fourth sub-sensing electrode 335 and the third sub-sensing electrode 315. In some exemplary embodiments of the present disclosure, the polarizing film POL and the first adhering member AM1 may be omitted. In this case, the second adhering member AM2 disposed at the lower portion of the window WD may come into direct contact with the fourth sub-sensing electrode 335 and the third sub-sensing electrode 315. The second adhering member AM2 may also be disposed in the separation space SP and come into direct contact with the upper surface of the insulating layer ILD that is exposed by the fourth sub-sensing electrode 335 and the third sub-sensing electrode 315.

Figure 16:
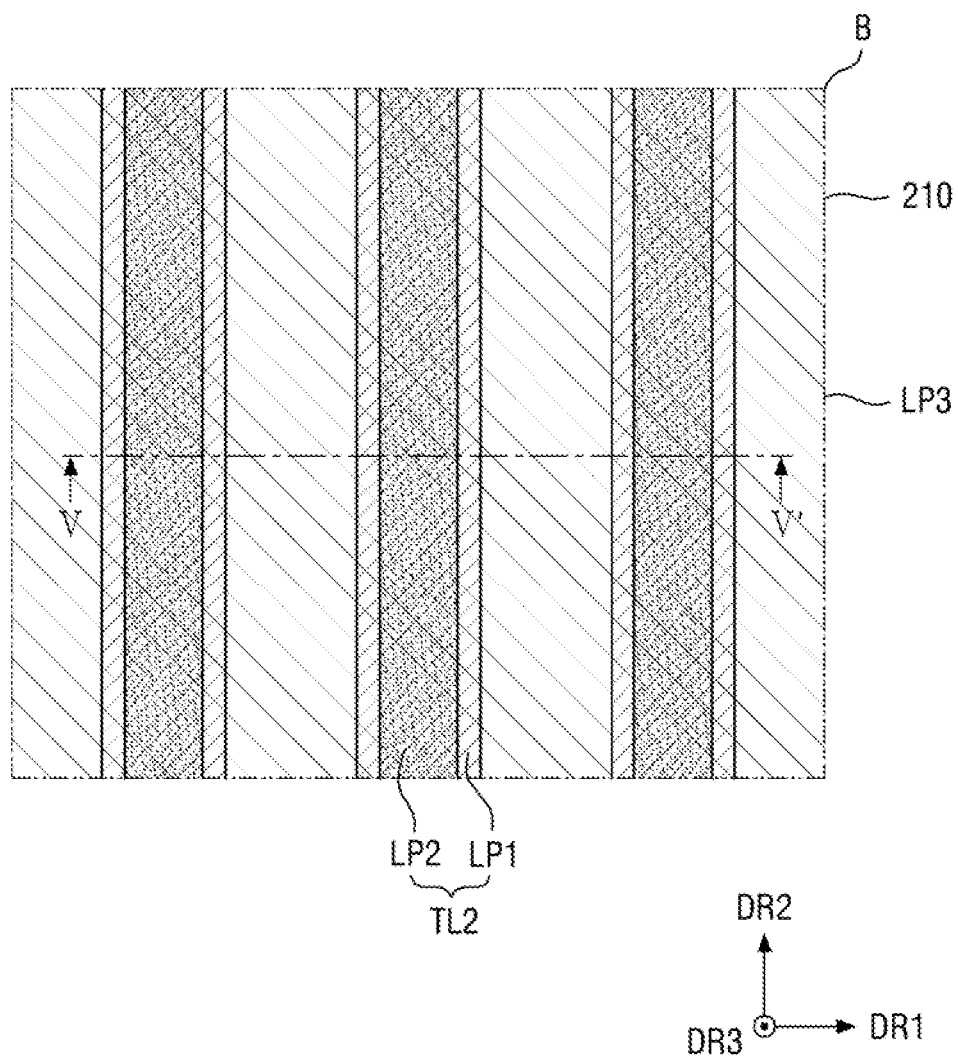
FIG. 16 is an enlarged view of area B of FIG. 8.
Figure 17:
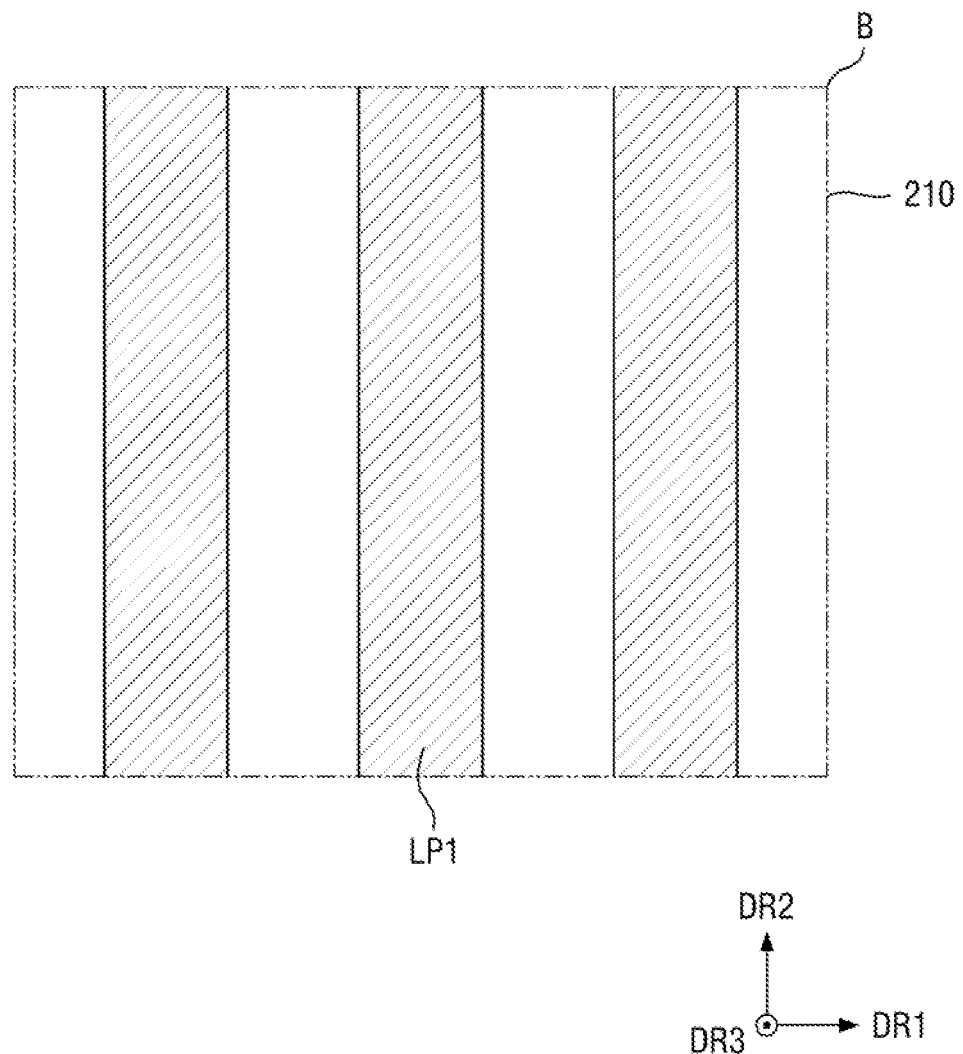
FIG. 17 is a view illustrating a first wiring portion of FIG. 16.
Figure 18:
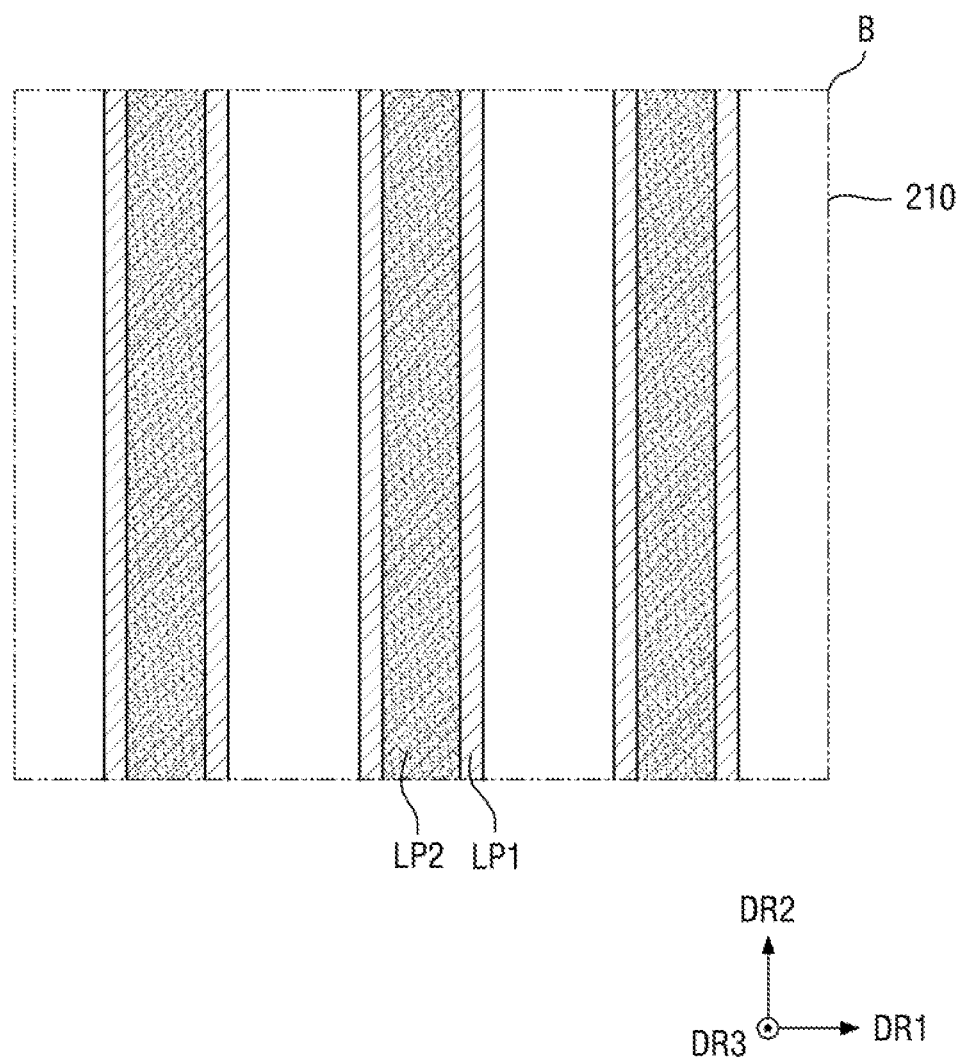
FIG. 18 is a view illustrating the first wiring portion and a second wiring portion of FIG. 16.
Figure 19:
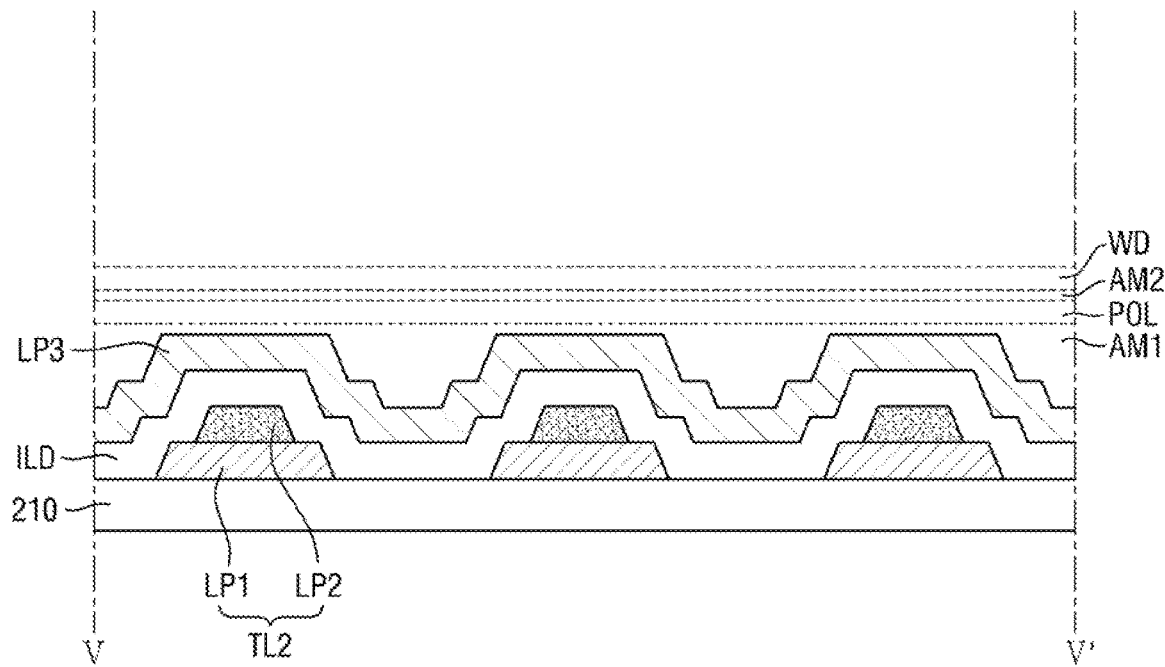
FIG. 19 is a cross-sectional view taken along line V-V' of FIG. 16.

FIG. 16 is an enlarged view of area B of FIG. 8, FIG. 17 is a view illustrating a first wiring portion of FIG. 16, FIG. 18 is a view illustrating the first wiring portion and a second wiring portion of FIG. 16, and FIG. 19 is a cross-sectional view taken along line V-V' of FIG. 16. In FIG. 19, the adhering members AM1 and AM2, the polarizing film POL, and the window WD are further illustrated.

Referring to FIGS. 3, 8, and 16 to 19, the width of the touch signal lines TL1 and IL2 may be smaller than an average width of the electrode portions 310 and 330. Because the resistance tends to be inversely proportional to the width, decreasing the resistance of the touch signal lines TL1 and TL2 themselves may be taken into consideration to prevent the above-described RC delay. However, because the touch signal lines TL1 and TL2 are disposed in the non-sensing area NSA which is narrower than the sensing area SA, increasing the width of the touch signal lines TL1 and TL2 themselves might not be easy. Thus, unlike the electrode portions 310 and 330 including a conductive material having light transmittance, the touch signal lines TL1 and TL2 may include an opaque conductive material of the second conductive layer ML2 whose resistance is lower than the conductive material having light transmittance.

For example, the second touch signal line TL2 may include the first wiring portion LP1 disposed on the second substrate 210 and the second wiring portion LP2 disposed on the first wiring portion LP1. The first wiring portion LP1 may be disposed in the first conductive layer ML1, and the second wiring portion LP2 may be disposed in the second conductive layer ML2. For example, the first conductive layer ML1 may further include the first wiring portion LP1 and the second conductive layer ML2 may thither include the second wiring portion LP2.

The first wiring portion LP1 may be disposed directly on the second substrate 210, and the second wiring portion LP2 may be disposed directly on the first wiring portion LP1 and electrically connected to the first wiring portion LP1. For example, since the second touch signal line TL2 includes the first wiring portion LP1 and the second wiring portion LP2 coming into contact with each other, even when the second wiring portion LP2 disposed on the first wiring portion LP1 is disconnected, the second touch pad portion TPD2 and the second electrode portion 330 may be electrically connected through the first wiring portion LP1 electrically connected to the second wiring portion LP2.

Because the width of the second wiring portion LP2 is smaller than the width of the first wiring portion LP1, an upper surface of the first wiring portion LP1 may be partially exposed. The insulating layer ILD may be disposed directly on the second wiring portion LP2 and may at least partially cover the first wiring portion LP1 and the second wiring portion LP2. For example, the insulating layer ILD may cover side surfaces of the first wiring portion LP1 and the second wiring portion LP2 and cover the exposed upper surface of the first wiring portion LP1 and the upper surface of the second wiring portion LP2. However, the width of the second wiring portion LP2 is not necessarily limited thereto and may also he equal to the width of the first wiring portion LP1 or larger than the width of the first wiring portion LP1 such that the second wiring portion LP2 covers the side surface of the first wiring portion LP1.

The second touch signal line TL2 may be provided as a plurality of second touch signal lines TL2, and the plurality of second touch signal lines TL2 may be spaced apart from each other. The first wiring portion LP1 of one second touch signal line TL2 may be spaced apart from the first wiring portion LP1 of another second touch signal line TL2 adjacent to the one second touch signal line TL2. Likewise, the second wiring portion LP2 of one second touch signal line TL2 may be spaced apart from the second wiring portion LP2 of another second touch signal line TL2 adjacent to the one second touch signal line TL2. The insulating layer ILD may come into direct contact with an upper surface of the second substrate 210 exposed by the second touch signal line TL2.

The cap pattern LP3 may be further disposed on the insulating layer ILD. The cap pattern LP3 may be disposed in the third conductive layer ML3. For example, the third conductive layer ML3 my further include the cap pattern LP3.

The cap pattern LP3 may come into direct contact with the insulating layer ILD. The cap pattern LP3 may have a width larger than that of a single second touch signal line TL2 and may prevent disconnection of the plurality of second touch signal lines TL2 by covering and protecting the plurality of second touch signal lines TL2.

The first adhering member AM1 may come into direct contact with the cap pattern LP3. In some exemplary embodiments of the present disclosure, the polarizing film POL and the first adhering member AM1 may be omitted. In this case, the second adhering member AM2 disposed at the lower portion of the window WD may come into direct contact with the cap pattern LP3.

The configurations of wiring portions, the relationship with the cap pattern LP3, and the like of the first touch signal line TL1 may be substantially the same as those of the second touch signal line TL2 except that configurations connected are different from the second touch signal line TL2. Therefore, it is evident that the description of the second touch signal line TL2 given above may be applied as it is to the first touch signal line TL1 except for the connection relationship between an electrode portion and a touch pad portion in the second touch signal line TL2.

Hereinafter, an exemplary embodiment of the present disclosure will be described, in the following embodiment, elements which are identical to those of the above-described embodiment will be denoted by like reference numerals, and to the extent that the descriptions thereof is omitted or simplified, it may be assumed that these elements are at least similar to corresponding elements that are described elsewhere within the present disclosure.

Figure 20:
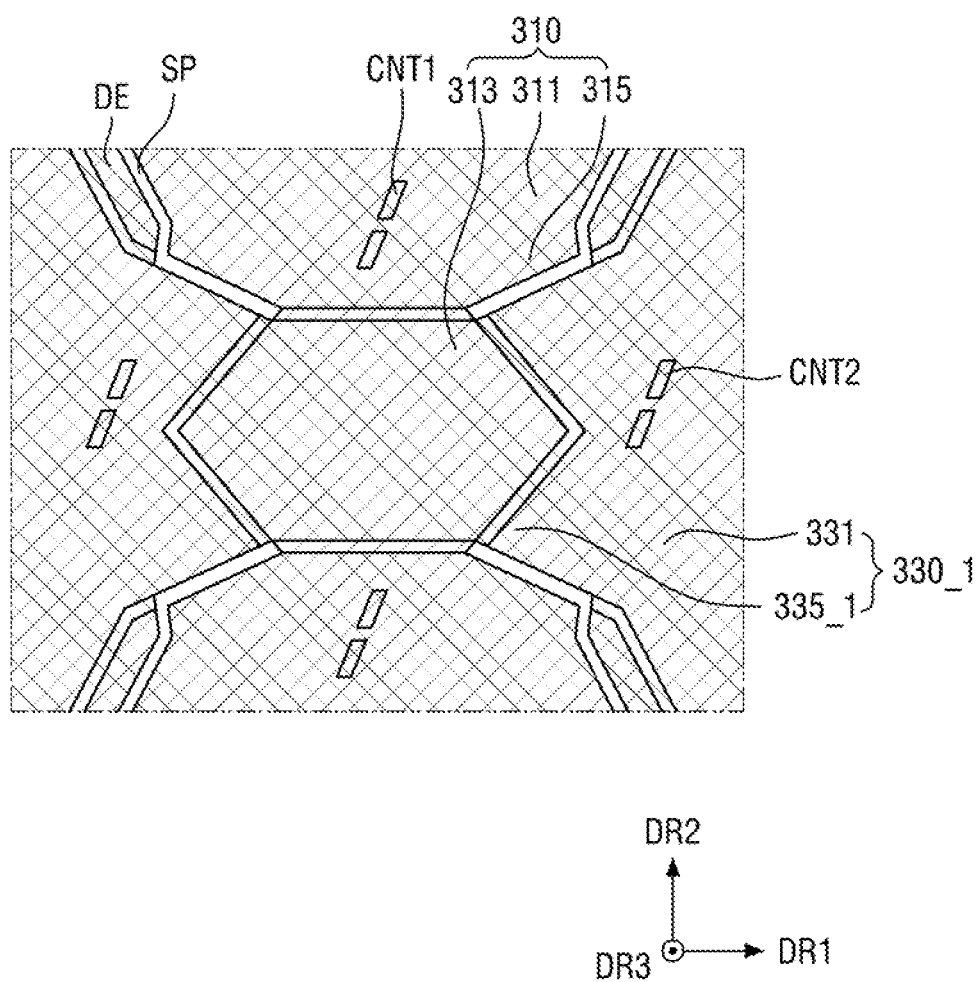
FIG. 20 is a plan view of a portion of a touch sensor according to an exemplary embodiment of the present disclosure.
Figure 21:
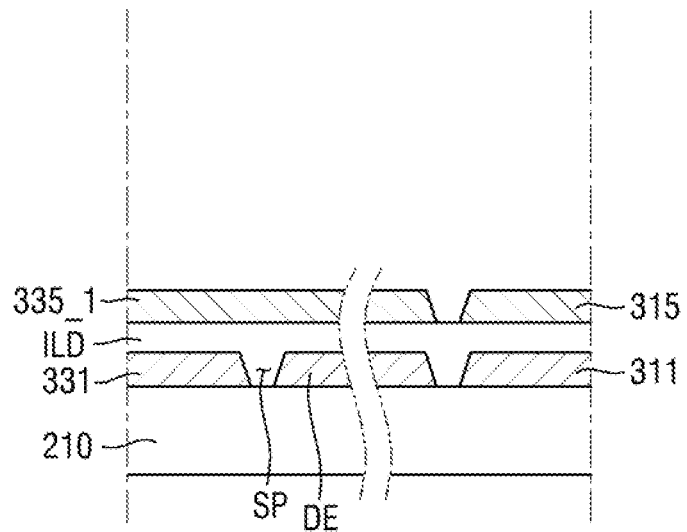
FIG. 21 is a cross-sectional view of FIG. 20.

FIG. 20 is a plan view of a portion of a touch sensor according to an exemplary embodiment of the present disclosure, and FIG. 21 is a cross-sectional view of FIG. 20.

Referring to FIGS. 20 and 21, the touch sensor, according to an exemplary embodiment of the present disclosure, is different from what is shown in FIGS. 10 and 15 in that a fourth sub-sensing electrode 335_1 of a second electrode portion 330_1 overlaps a dummy electrode DE.

For example, the fourth sub-sensing electrode 335_1 of the second electrode portion 330_1 may at least partially overlap the dummy electrode DE and, further, may also at least partially overlap a separation space between the dummy electrode DE and a second sub-sensing electrode 331. When a conductive layer is not disposed at an upper portion of the separation space between the dummy electrode DE and the second sub-sensing electrode 331, a reflectance difference may occur in the thickness direction between the separation space and a surrounding portion (where a conductive layer is disposed) of the separation space, and a pattern may be viewed from the outside. However, according to the present embodiment, because the fourth sub-sensing electrode 335_1 of the second electrode portion 330_1 at least partially overlaps the dummy electrode DE and, further, also at least partially overlaps the separation space between the dummy electrode DE and the second sub-sensing electrode 331, viewing of the pattern may be prevented.

In FIG. 21, an inner side surface of the fourth sub-sensing electrode 335_1 is illustrated as being aligned in the thickness direction to a side surface of the dummy electrode DE that opposes a first sub-sensing electrode 311. However, the present disclosure is not necessarily limited thereto, and the inner side surface of the fourth sub-sensing electrode 335_1 may be disposed between the side surface of the dummy electrode DE that opposes the first sub-sensing electrode 311 and a side surface of the dummy electrode DE that opposes the second sub-sensing electrode 331.

Figure 22:
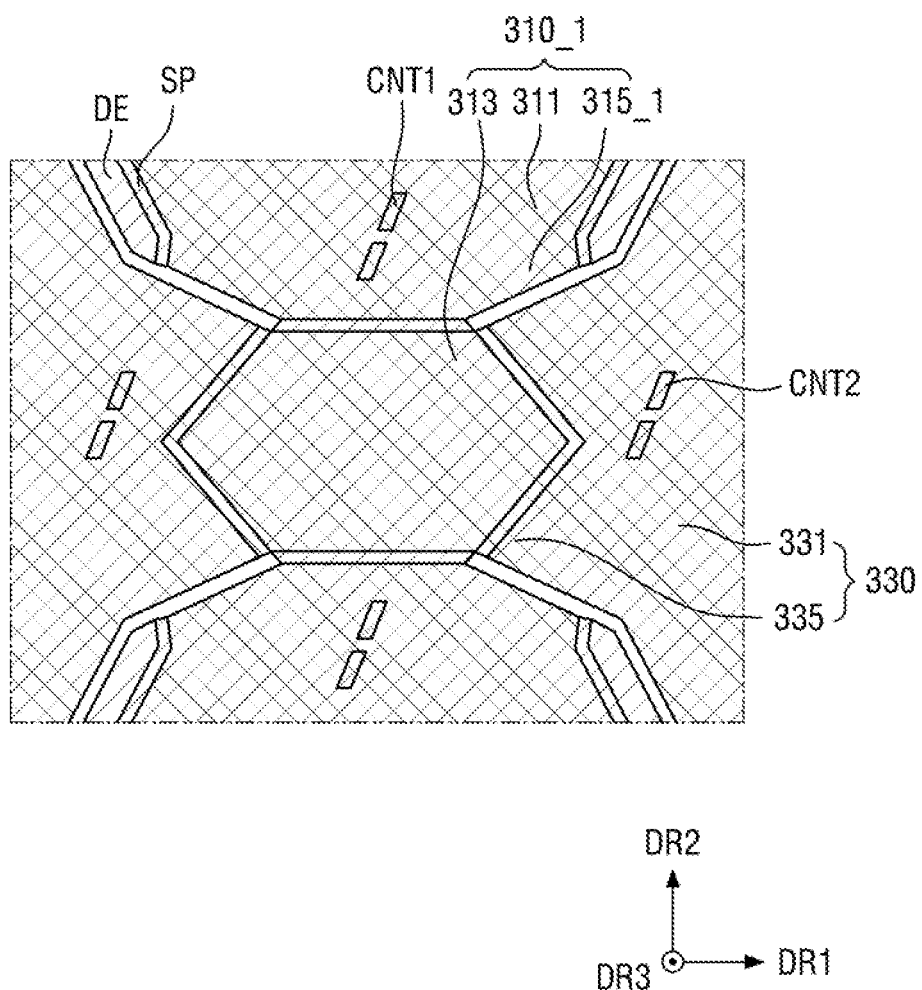
FIG. 22 is a plan view illustrating a portion of a touch sensor according to an exemplary embodiment of the present disclosure.
Figure 23:
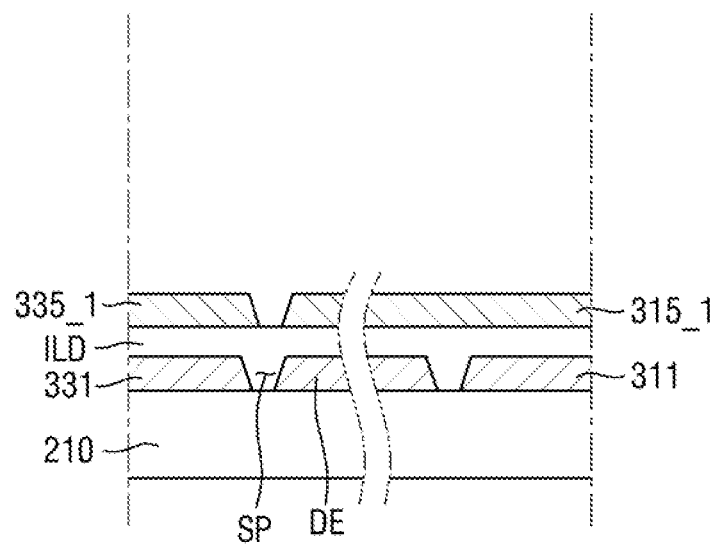
FIG. 23 is a cross-sectional view of FIG. 22.

FIG. 22 is a plan view of a portion of a touch sensor according to an exemplary embodiment of the present disclosure, and FIG. 23 is a cross-sectional view of FIG. 22.

Referring to FIGS. 22 and 23, the touch sensor, according to the present embodiment, is different from what is shown in FIGS. 10 and 15 in that a third sub-sensing electrode 315_1 of a first electrode portion 310_1 overlap a dummy electrode DE.

For example, the third sub-sensing electrode 315_1 of the first electrode portion 310_1 may at least partially overlap the dummy electrode DE and, further, may also at least partially overlap a separation space between the dummy electrode DE and a first sub-sensing electrode 311. In this way, viewing of a pattern due to a separation space between the dummy electrode DE and a first sub-sensing electrode 311 may be prevented.

In FIG. 23, an inner side surface of the third sub-sensing electrode 315_1 is illustrated as being aligned in the thickness direction to a side surface of the dummy electrode DE that opposes a second sub-sensing electrode 331. However, the present disclosure is not necessarily limited thereto, and the inner side surface of the third sub-sensing electrode 315_1 may be disposed between the side surface of the dummy electrode DE that opposes the second sub-sensing electrode 331 and a side surface of the dummy electrode DE that opposes the first sub-sensing electrode 311.

Figure 24:
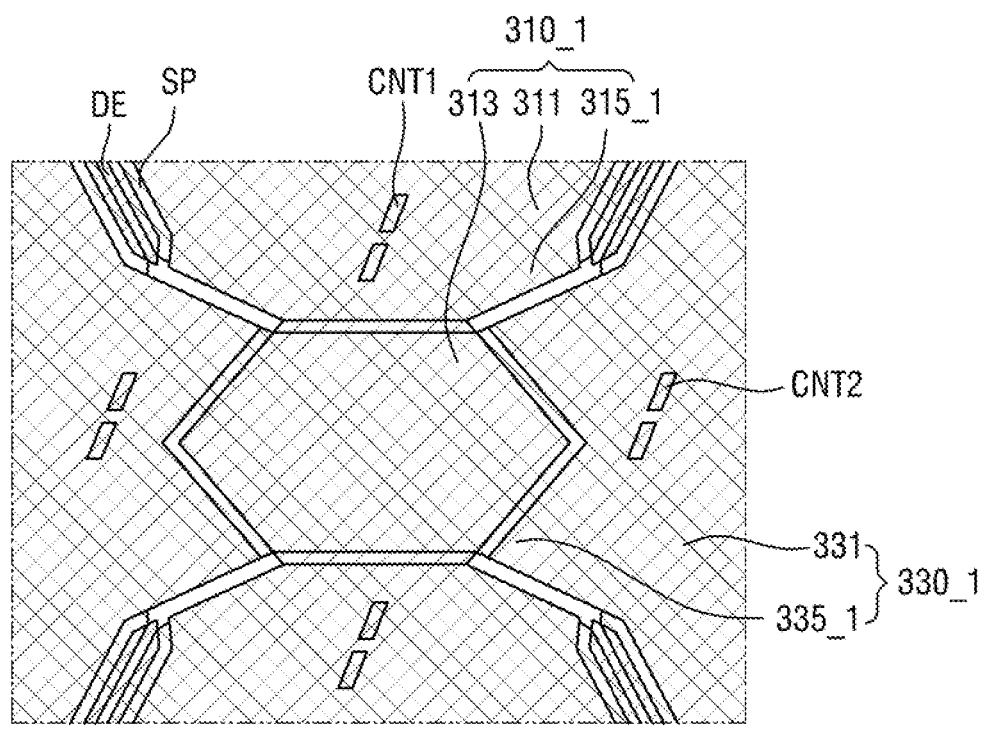
FIG. 24 is a plan view illustrating a portion of a touch sensor according to an exemplary embodiment of the present disclosure.
Figure 25:
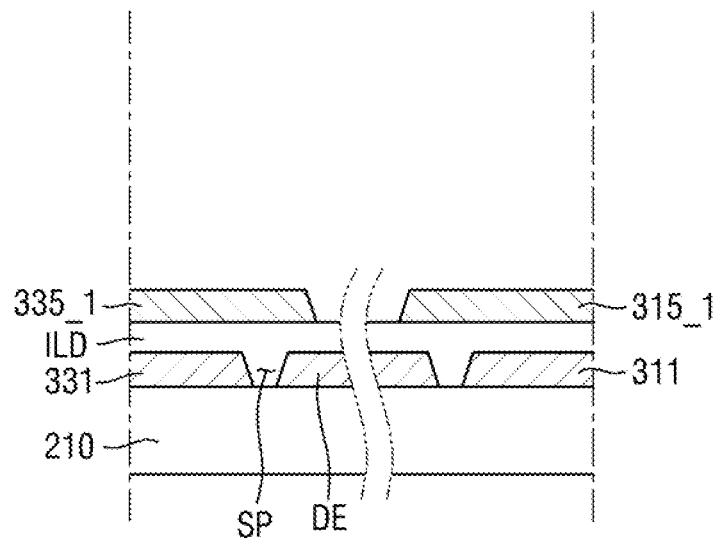
FIG. 25 is a cross-sectional view of FIG. 24.

FIG. 24 is a plan view illustrating a portion of a touch sensor according to an exemplary embodiment of the present disclosure, and FIG. 25 is a cross-sectional view of FIG. 24.

Referring to FIGS. 24 and 25, the touch sensor according to the present embodiment is different from what is shown in FIGS. 20 and 21 in that not only a fourth sub-sensing electrode 335_1 of a second electrode portion 330_1 but also a third sub-sensing electrode 315_1 of a first electrode portion 310_1 at least partially overlaps a dummy electrode DE.

For example, according to the present embodiment, the fourth sub-sensing: electrode 335_1 of the second electrode portion 330_1 and the third sub-sensing electrode 315_1 of the first electrode portion 310_1 may each at least partially overlap the dummy electrode DE. The fourth sub-sensing electrode 335_1 and the third sub-sensing electrode 315_1 may be spaced apart from each other with a predetermined separation space disposed therebetween a width of the dummy electrode DE may be larger than a width of the separation space, and, in the plan view, the dummy electrode DE may completely cover the separation space.

Figure 26:
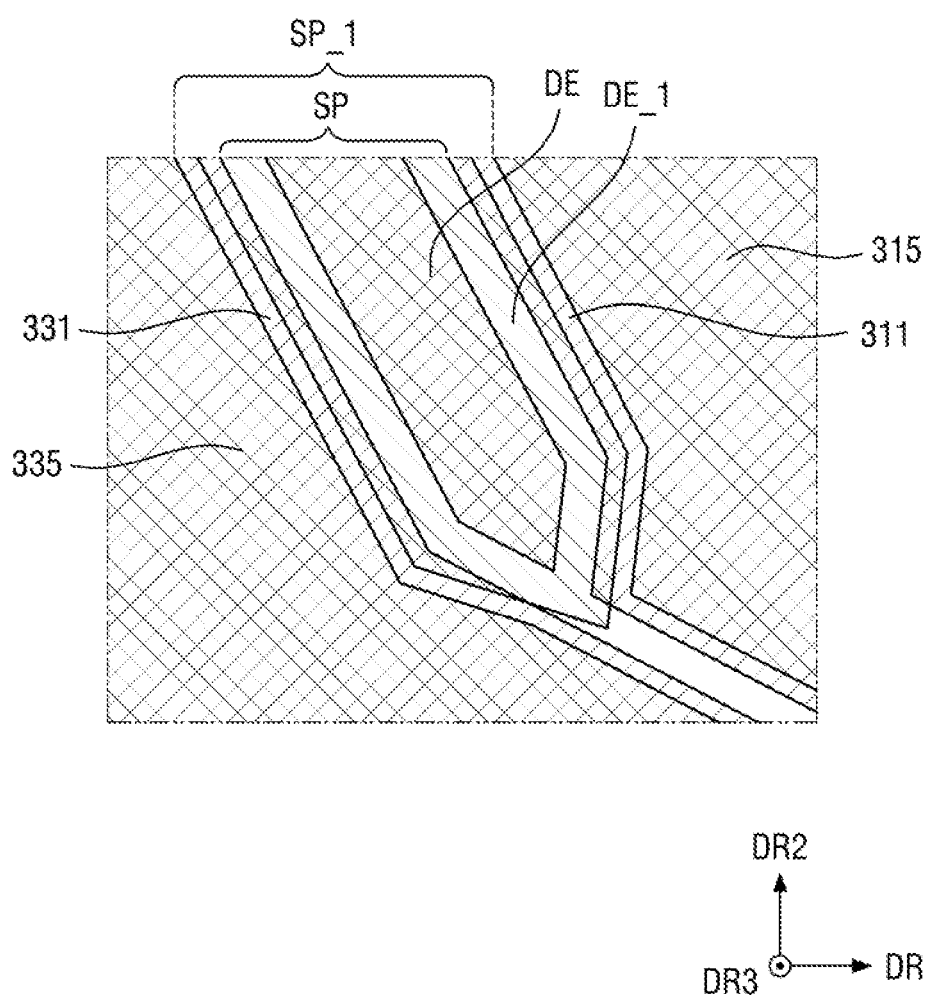
FIG. 26 is a plan view illustrating a portion of a touch sensor according to an exemplary embodiment of the present disclosure.
Figure 27:
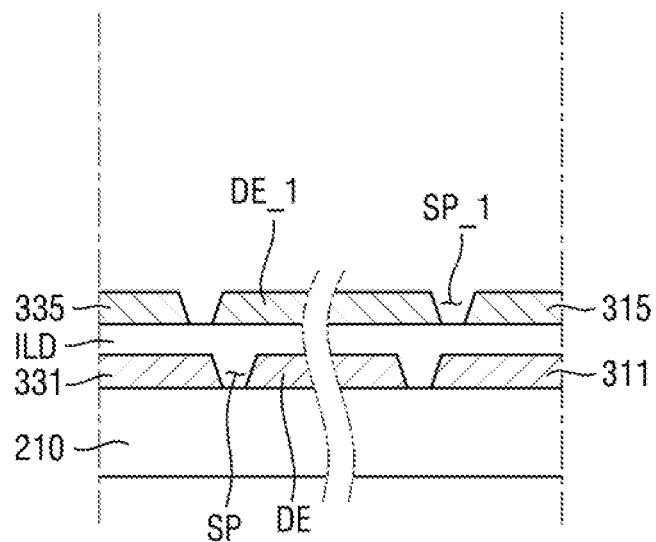
FIG. 27 is a cross-sectional view of FIG. 26.

FIG. 26 is a plan view of a portion of a touch sensor according to an exemplary embodiment of the present disclosure, and FIG. 27 is a cross-sectional view of FIG. 26.

Referring to FIGS. 26 and 27, the touch sensor, according to an exemplary embodiment of the present disclosure is different from what is shown in FIGS. 10 and 15 in that a third sub-sensing electrode 315 and a fourth sub-sensing electrode 335 are spaced apart from each other with a separation space SP_1, whose width is larger than that of the separation space SP described above, disposed therebetween and in that dummy electrodes DE_1, which are disposed in the same layer as the sub-sensing electrodes 315 and 335, are further disposed in the separation space SP_1.

For example, the third sub-sensing electrode 315 and the fourth sub-sensing electrode 335 may be spaced apart from each other with the separation space SP_1, whose width is larger than that of the separation space SP described above, disposed therebetween, and the dummy electrodes DE_1, which are disposed in the same layer as the sub-sensing electrodes 315 and 335, may be further disposed in the separation space SP_1. The dummy electrodes DE_1 may be disposed, in the third conductive layer ML3 of FIG. 3. For example, the third conductive layer ML3 may further include the dummy electrodes DE_1.

The sub-sensing electrodes 315 and 335 may include inner side surfaces which are more indented in a direction moving away from the dummy electrodes DE_1 than inner side surfaces of sub-sensing electrodes 311 and 331 corresponding thereto. In the plan view, the dummy electrodes DE_1 may overlap the separation space SP between the first sub-sensing electrode 311 and the second sub-sensing electrode 331, and, because the width of the dummy electrode DE_1 is larger than the width of the separation space SP, the dummy electrode DE_1 may completely cover the separation space SP. Further, the dummy electrodes DE_1 may partially overlap the sub-sensing electrodes 311 and 331 therebelow. For example, the inner side surfaces of the sub-sensing electrodes 311 and 331 may be disposed between both side surfaces (at inner sides of the both side surfaces) of the dummy electrodes DE_1. The separation space between the sub-sensing electrodes 315 and 335 adjacent to the dummy electrodes DE_1 may overlap the sub-sensing electrodes 311 and 331 therebelow, and the sub-sensing electrodes 311 and 331 may completely cover the separation space between the sub-sensing electrodes 315 and 335 adjacent to the dummy electrodes DE_1.

According to the present embodiment, in the plan view, the dummy electrodes DE_1 may at least partially overlap the separation space SP between the first sub-sensing electrode 311 and the second sub-sensing electrode 331, and, because the width of the dummy electrode DE_1 is larger than the width of the separation space SP, the dummy electrode DE_1 may completely cover the separation space SP so that, by the dummy electrodes DE_1 covering the separation space between the sub-sensing electrodes 311 and 331 and the dummy electrodes DE, viewing of a pattern is prevented. Further, viewing of the pattern may be prevented by covering the separation space between the dummy electrodes DE_1 and the sub-sensing electrodes 315 and 335 by the sub-sensing electrodes 311 and 331 therebelow.

In some exemplary embodiments of the present disclosure, the arrangement relationship between the first conductive layer ML1 and the second conductive layer ML3 of FIGS. 26 and 27 may be reversed upside down. For example, the third sub-sensing electrode 315 and the fourth sub-sensing electrode 335 may be spaced apart with a separation space SP_1, whose width is smaller than that of the separation space SP, disposed therebetween, and dummy electrodes DE_1 disposed in the same layer as the sub-sensing electrodes 315 and 335 may be thither disposed in the separation space SP_1. The sub-sensing electrodes 315 and 335 may include inner side surfaces which are disposed to protrude further in a direction approaching the dummy electrodes DE_1 than the inner side surfaces of the sub-sensing electrodes 311 and 331 corresponding thereto. In the plan view, the dummy electrodes DE may at least partially overlap the separation space SP_1 between the third sub-sensing electrode 315 and the fourth sub-sensing electrode 335, and, because the width of the dummy electrode DE is larger than the width of the separation space SP_1, the dummy electrode DE may completely cover the separation space SP_1. Further, the dummy electrodes DE may partially overlap the sub-sensing electrodes 315 and 335 thereabove. For example, the inner side surfaces of the sub-sensing electrodes 315 and 335 may be disposed between more inward than both side surfaces of the dummy electrodes DE. The separation space between the sub-sensing electrodes 311 and 331 adjacent to the dummy electrodes DE may at least partially overlap the sub-sensing electrodes 315 and 335 thereabove, and the sub-sensing electrodes 315 and 335 may completely cover the separation space between the sub-sensing electrodes 311 and 331 adjacent to the dummy electrodes DE.

Figure 28:
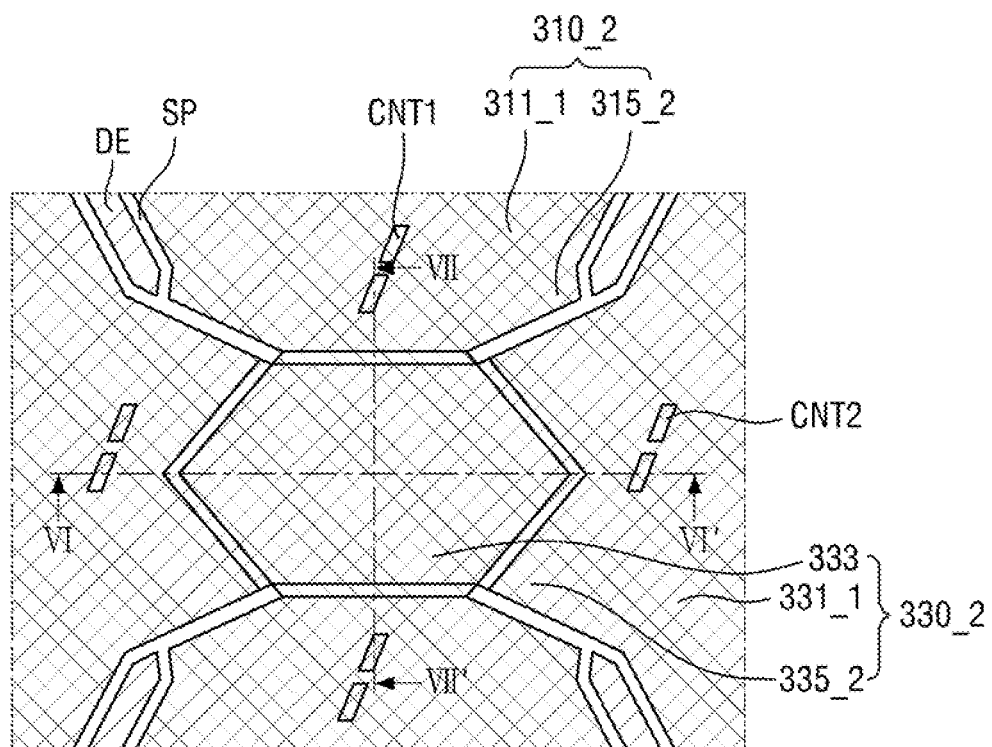
FIG. 28 is a plan view illustrating a portion of a touch sensor according to an exemplary embodiment of the present disclosure.
Figure 29:
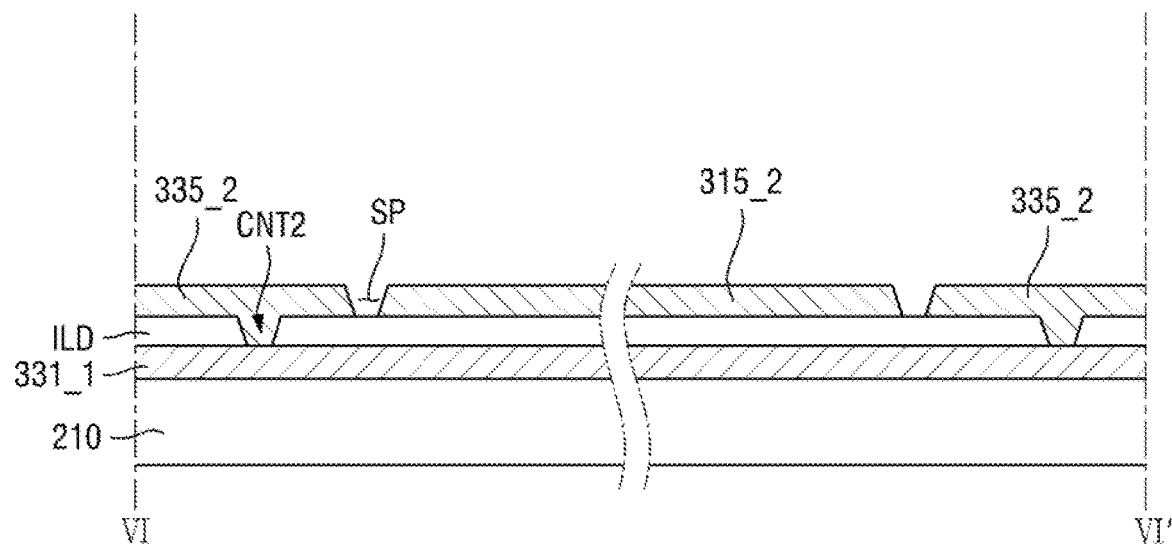
FIG. 29 is a cross-sectional view taken along line VI-VI' of FIG. 28.
Figure 30:
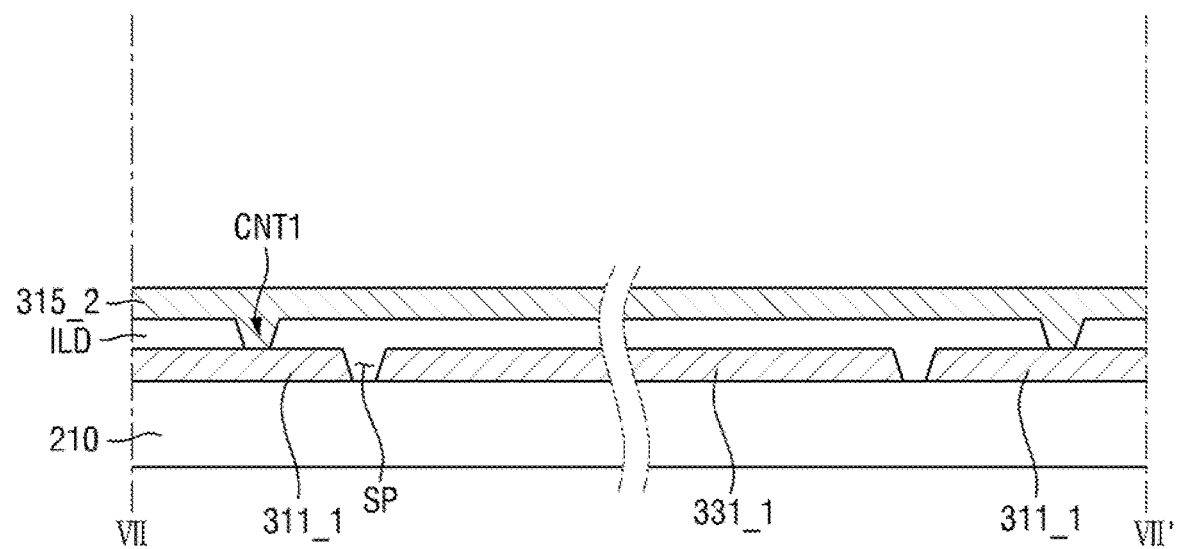
FIG. 30 is a cross-sectional taken along line VII-VII' of FIG. 28.

FIG. 28 is a plan view of a portion of a touch sensor according to an exemplary embodiment of the present disclosure, FIG. 29 is a cross-sectional view taken along line VI-VI' of FIG. 28, and FIG. 30 is a cross-sectional view taken along line VII-VII' of FIG. 28.

Referring to FIGS. 28 to 30, in the touch sensor according to the present embodiment, a first electrode portion 310_2 has the same arrangement and shape as the second electrode portion 330 of FIG. 10, except that the first electrode portion 310_2 extends primarily in the first direction DR1, and a second electrode portion 330_2 has the same arrangement and shape as the first electrode portion 310 of FIG. 10, except that the second electrode portion 330_2 extends primarily in the second direction DR2.

For example, each second electrode portion 330_2 may include a plurality of second sub-sensing electrodes 331_1 spaced apart from each other in the first direction DR1, a sensing connecting portion 333 which physically connects the second sub-sensing electrodes 331_1 adjacent to each other, and a fourth sub-sensing electrode 335_2 disposed on the second sub-sensing electrodes 331_1 and electrically connected to the second sub-sensing electrodes 331_1 through the second contact hole CNT2 of the insulating layer ILD. The second sub-sensing electrodes 331_1 of the second electrode portion 330_2 and the sensing connecting portion 333 which connects the second sub-sensing electrodes 331_1 adjacent to each other may have a linear shape extending primarily in the first direction DR1.

The first electrode portion 310_2 may extend primarily in the second direction DR2. The first electrode portion 310_2 may be provided as a plurality of first electrode portions 310_2, and the plurality of first electrode portions 310_2 may be spaced apart from each other in the first direction DR1. The first electrode portion 310_2 may be electrically insulated from the second electrode portion 330_2. Each first electrode portion 310_2 may include a plurality of first sub-sensing electrodes 311_1 spaced apart from each other in the second direction DR2, and a third sub-sensing electrode 315_2 electrically connected to the first sub-sensing electrodes 311_1 through the first contact hole CNT1 of the insulating layer ILD. The first sub-sensing electrode 311_1 may be spaced apart from the second sub-sensing electrode 331_1 adjacent thereto with a predetermined separation space SP disposed therebetween and may be electrically insulated from the second sub-sensing electrode 331_1. Meanwhile, although the plurality of second sub-sensing electrodes 331_1 spaced apart from each other in the first direction DR1 form a linear shape by being electrically connected by the sensing connecting portion 333 disposed in the same layer (the first conductive layer ML1), because the plurality of first sub-sensing electrodes 311_1, which are disposed in the same layer as the second sub-sensing electrodes 331_1 and spaced apart from each other in the second direction DR2, are insulated front the second electrode portion 330_2 as described above, the first sub-sensing electrodes 311_1 adjacent to each other may be electrically connected through the third sub-sensing electrode 315_2 disposed in a layer (the third conductive layer ML3) that is different from the first conductive layer ML_1. The third sub-sensing electrode 315_2 may be spaced apart from the fourth sub-sensing electrode 335_2 adjacent thereto with a predetermined separation space SP disposed therebetween and may be electrically insulated from the fourth sub sensing electrode 335_2.

Figure 31:
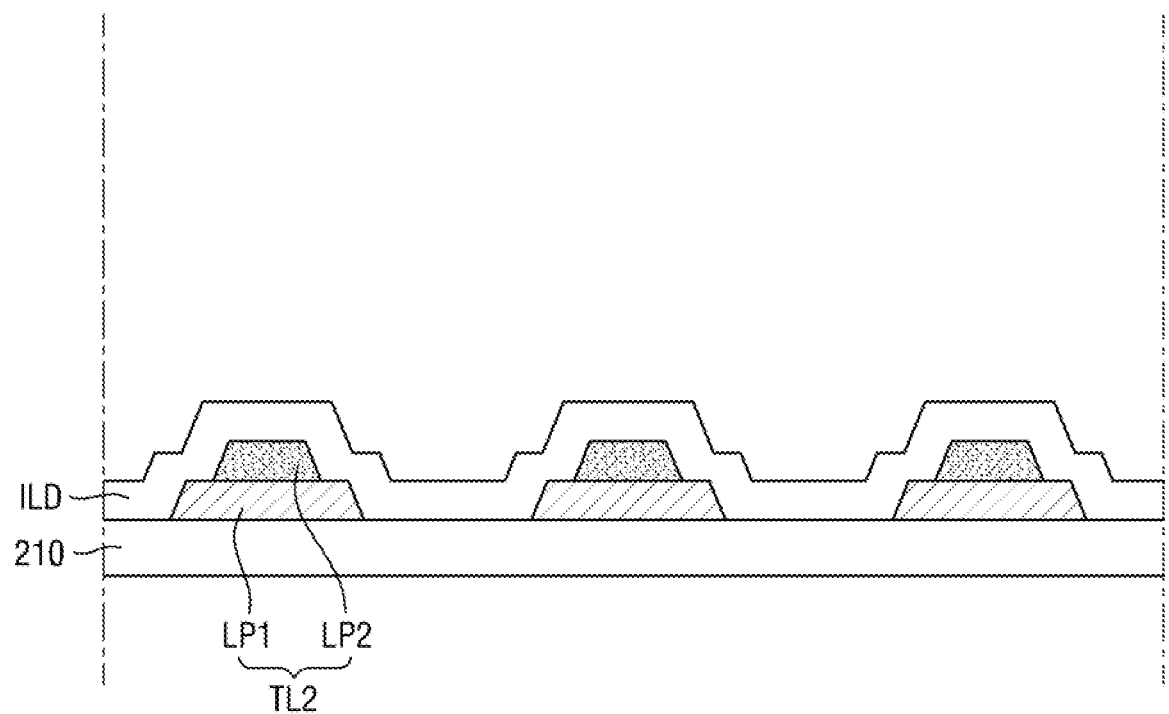
FIG. 31 is a modified example of an embodiment of FIG. 19.

FIG. 31 is a modified example of an embodiment of FIG. 19.

Referring to FIG. 31, a touch sensor, according to the present embodiment, is different from what is shown in FIG. 19 in that the cap pattern LP3 which covers the plurality of second touch signal lines TL2 is omitted.

Since all the other details are the same as those described above with reference to FIGS. 16 to 19, overlapping descriptions will be omitted and it may be assumed that these elements for which a description has been omitted are at least similar to corresponding elements that are described elsewhere within the present disclosure.

Figure 32:
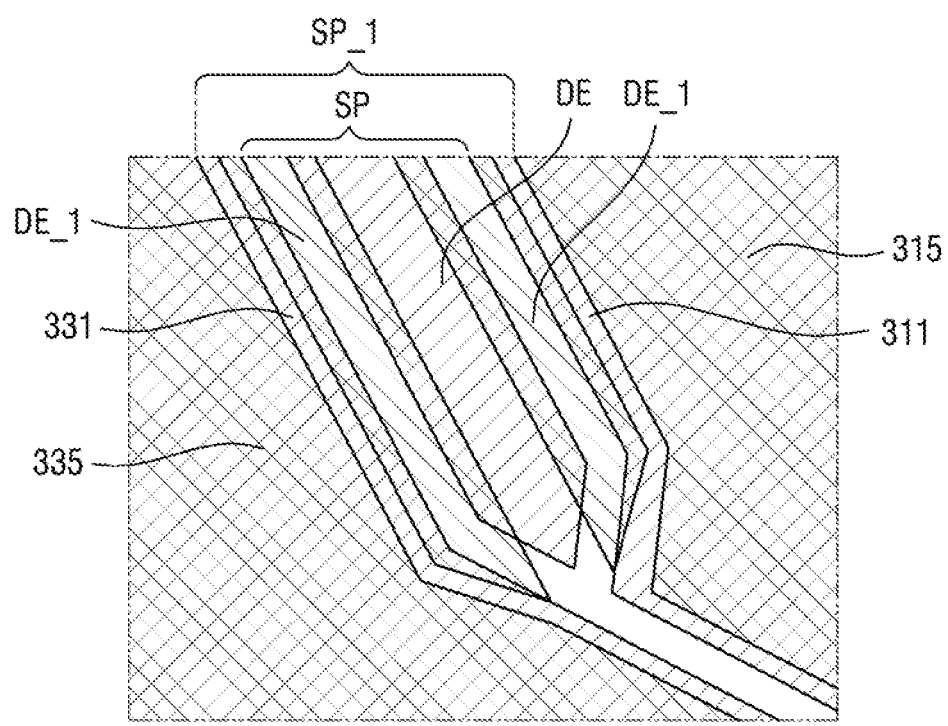
FIG. 32 is a plan view illustrating a portion of a touch sensor according to an exemplary embodiment of the present disclosure.
Figure 33:
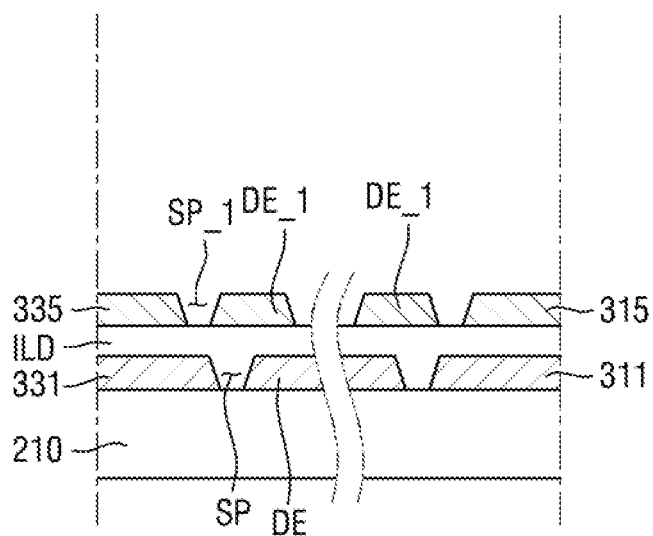
FIG. 33 is a cross-sectional view of FIG. 32.

FIG. 32 is a plan view of a portion of a touch sensor according to an exemplary embodiment of the present disclosure, and FIG. 33 is a cross-sectional view of FIG. 32.

Referring to FIGS. 32 and 33, the touch sensor, according to the present embodiment, is different from what is shown in FIGS. 26 and 27 in that dummy electrodes DE_1 may be formed as a plurality of patterns.

For example, in the touch sensor, according to the present embodiment, the dummy electrodes DE_1 may include a first pattern which covers a separation space between dummy electrodes DE and first sub-sensing electrodes 311 and a second pattern which covers a separation space between the dummy electrodes DE and second sub-sensing electrodes 331.

The first pattern and the second pattern may be spaced apart from each other with a predetermined separation space disposed therebetween, the separation space between the first pattern and the second pattern may at least partially overlap the dummy electrodes DE in the thickness direction, and the dummy electrodes DE may completely cover the separation space between the first pattern and the second pattern.

According to a touch sensor and a display device according to an exemplary embodiment of the present disclosure, the resistance of electrode portions of the touch sensor can be lowered.

Although exemplary embodiments of the present disclosure of the invention have been disclosed for illustrative purposes, those skilled in the art will appreciate that various modifications, additions and substitutions are possible, without departing from the scope and spirit of the present disclosure.

What is claimed is:

1. A display device, comprising:
a first substrate;
a plurality of light emitting elements disposed on the first substrate;
a second substrate disposed opposite the first substrate; and
a touch sensor disposed on the second substrate,
wherein the touch sensor includes a first touch conductive layer which is disposed on the second substrate and includes a first transparent conductive material and a first dummy electrode, a touch insulating layer disposed on the first touch conductive layer, and a second touch conductive layer which is disposed on the touch insulating layer and includes a second transparent conductive material,
wherein the first touch conductive layer includes a plurality of first sub-sensing electrodes arranged in a first direction, a connecting portion connecting the first sub-sensing electrodes adjacent to each other, and a plurality of second sub-sensing electrodes which are arranged in a second direction crossing the first direction and are spaced apart from the first sub-sensing electrodes and the connecting portion, and
wherein the second touch conductive layer includes a third sub-sensing electrode electrically connected to one of the first sub-sensing electrodes through a plurality of first contact holes passing through the touch insulating layer, and a fourth sub-sensing electrode which is electrically connected to one of the second sub-sensing electrodes through a plurality of second contact holes passing through the touch insulating layer so as to electrically connect the second sub-sensing electrodes adjacent to each other and is spaced apart from the third sub-sensing electrode,
wherein the limrth sub-sensing electrode at least partially overlaps the first dummy electrode.

2. The display device of claim 1, wherein the third sub-sensing electrode at least partially overlaps the first sub-sensing electrode, and the fourth sub-sensing electrode at least partially overlaps the second sub-sensing electrode.

3. The display device of claim 2, wherein the fourth sub-sensing electrode extends primarily in the second direction, at least partially overlaps the connecting portion in a thickness direction, and is electrically insulated from the connecting portion.

4. The display device of claim 3, wherein:
the first dummy electrode is disposed between the first sub-sensing electrode and the second sub-sensing electrode which are adjacent to each other; and
the first dummy electrode is a floating electrode which is spaced apart from the first sub-sensing electrode adjacent thereto with a space therebetween and spaced apart from the second sub-sensing electrode adjacent thereto with a space therebetween.

5. The display device of claim 4, wherein:
the fourth sub-sensing electrode at least partially covers the separation space between the first dummy electrode and the second sub-sensing electrode; and
the third sub-sensing electrode at least partially covers the space between the first dummy electrode and the first sub-sensing electrode and of at least partially overlaps the first dummy electrode.

6. The display device of claim 4, wherein:
the second touch conductive layer further includes a second dummy electrode disposed between the third sub-sensing electrode and the fourth sub-sensing electrode which are adjacent to each other: and
the second dummy electrode is spaced apart from the third sub-sensing electrode adjacent thereto with a space therebetween and spaced apart from the fourth sub-sensing electrode adjacent thereto with a space therebetween.

7. The display device of claim 3, wherein:
the touch sensor further includes a third touch conductive layer disposed between the first touch conductive layer and the touch insulating layer; and
the third touch conductive layer includes an opaque conductive material.

8. The display device of claim 7, wherein:
the touch sensor further includes a plurality of touch wires connected to the plurality of first sub-sensing electrodes or the plurality of second sub-sensing electrodes;
the plurality of touch wires includes a first wire portion and a second wire portion disposed on the first wire portion;
the first touch conductive layer further includes the first wire portion; and
the third touch conductive layer further includes the second wire portion.

9. The display device of claim 8, wherein the second wire portion is disposed directly o the first wire portion and is electrically connected to the first wire portion.

10. The display device of claim 8, wherein the touch sensor further includes a cap pattern covering the plurality of touch wires, and the second touch conductive layer further includes the cap pattern.

11. The display device of claim 3, wherein the first transparent conductive material and the second transparent conductive material each include amorphous indium tin oxide.

12. The display device of claim 3, wherein the first substrate includes a display substrate, the second substrate includes an encapsulation substrate sealing the plurality of light emitting elements, and the touch sensor is disposed directly on the encapsulation substrate.

13. The display device of claim 3, wherein each sub-sensing electrode of the first sub-sensing electrodes, the second sub-sensing electrodes, the third sub-sensing electrode, and the fourth sub-sensing electrodes have a planar shape.

14. The display device of claim 3, further comprising a polarizing film disposed on the touch sensor and an adhering member disposed between the polarizing film and the touch sensor,
wherein the adhering member directly contacts the second touch conductive layer.

15. The display device of claim 3, wherein
planar profiles of third sub-sensing electrode and the first sub-sensing electrode, which overlaps the third sub-sensing electrode in the thickness direction, are the same; and planar profiles of the fourth sub-sensing electrode and the second sub-sensing electrode, which overlaps the fourth sub-sensine electrode in the thickness direction, are the same.

16. A display device, comprising:
a first substrate;
a plurality of light emittingelements disposed on the first substrate;
a second substrate disposed opposite the first substrate; and
a touch sensor disposed on the second substrate,
wherein the touch sensor includes a first touch conductive layer which is disposed on the second substrate and includes a first transparent conductive material, a touch insulating layer disposed on the first touch conductive layer, and a second touch conductive layer which is disposed on the touch insulating layer and includes a second transparent conductive material.
wherein the first touch conductive layer includes a plurality of first sub-sensim electrodes arranged in a first direction, a connecting portion connecting the first sub-sensing electrodes adjacent to each other, and a plurality of second sub-sensing electrodes which are arranged in a second direction crossing the first direction and are spaced apart from the first sub-sensing electrodes and, the connecting ting portion,
wherein the second touch conductive layer includes a third sub-sensing electrode electrically connected to one of the first sub-sensing electrodes through a plurality of first contact holes passing through the touch insulating layer, and a fourth sub-sensing electrode which is electrically connected to one of the second sub-sensing electrodes through a plurality of second contact holes passing through the touch insulating layer so as to electrically connect the second sub-sensing electrodes adjacent to each other and is spaced apart from the third sub-sensing electrode,
wherein the third sub-sensing electrode at least partially overlaps the first sub-sensing electrode, and the fourth sub-sensing electrode at least partially overlaps the second sub-sensing electrode,
wherein the first touch conductive layer further includes a first dummy electrode disposed between the first sub-sensing electrode and the second sub-sensing electrode which are adjacent to each other,
wherein the first dummy electrode is a floating electrode which is spaced apart from the first sub-sensing electrode adjacent thereto with a space therebetween and spaced apart from the second sub-sensing electrode adjacent thereto with a space therebetween,
wherein the second touch conductive layer further includes a second dummy electrode disposed between the third sub-sensing electrode and the fourth sub sensing electrode which are adjacent to each other,
wherein the second dummy electrode is spaced apart from the third sub-sensing electrode adjacent thereto with a space therebetween and spaced apart from the fourth sub-sensing electrode adjacent thereto with a space therebetween, and
wherein a width of the second dummy electrode is larger than a width of the first dummy electrode, and the second dummy electrode at least partially covers the space between the first dummy electrode and the second sub-sensing electrode and the space between the first dummy electrode and the first sub-sensing electrode.

17. The display device of claim 16, wherein the second dummy electrode includes a plurality of dummy patterns separated from each other, and the first dummy electrode covers a space between the dummy patterns that are adjacent to each other.

18. A touch sensor, comprising:
a first touch conductive layer including a first transparent conductive material;
a touch insulating layer disposed on the first touch conductive layer; and
a second touch conductive layer disposed on the touch insulating layer and including a second transparent conductive material,
wherein the first touch conductive layer includes a plurality of first sub-sensing electrodes arranged in a first direction, a connecting portion configured to connect the first sub-sensing electrodes adjacent to each other, a plurality of second sub-sensing electrodes which are arranged in a second direction crossing the first direction and are spaced apart from the first sub-sensing electrodes and the connecting portion, and a first dummy electrode,
wherein the second touch conductive layer includes a third sub-sensing electrode electrically connected to one of the first sub-sensing electrodes through a plurality of first contact holes passing, through the touch insulating layer, and a fourth sub-sensing electrode which is electrically connected to one of the second sub-sensing electrodes through a plurality of second contact holes passing through the touch insulating layer electrically connecting the second sub-sensing electrodes adjacent to each other, and is spaced apart from the third sub-sensing electrode,
wherein the fourth sub-sensing electrode at least partially overlaps the first dummy electrode.

19. The touch sensor of claim 18, wherein:
the third sub-sensing electrode at least partially overlaps the first sub-sensing electrode;
the tburth sub-sensing electrode at least partially overlaps the second sub-sensing electrode;
the fourth sub-sensing electrode extends primarily in the second direction; and
the fourth sub-sensing electrode at least partially overlaps the connecting portion in a thickness direction and is electrically insulated from the connecting portion.

20. The touch sensor of claim 18, further comprising a third touch conductive layer disposed between the first touch conductive layer and the touch insulating layer, wherein:
the third touch conductive layer includes an opaque conductive material;
the touch sensor further includes a plurality of touch wires connected to the plurality of first sub-sensing electrode or the plurality of second sub-sensing electrode; and
the plurality of touch wires includes a first wire portion and a second wire portion disposed on the first wire portion, the first touch conductive layer further includes the first wire portion, and the third touch conductive layer further includes the second wire portion.

* * * * *